(12) United States Patent
Lee et al.

(10) Patent No.: US 12,170,344 B2
(45) Date of Patent: Dec. 17, 2024

(54) DISPLAY DEVICE INCLUDING PARTITIONING WALL COMPRISING TRANSPARENT CONDUCTIVE OXIDE AND METHOD FOR MANUFACTURING THE SAME

(71) Applicant: Samsung Display Co., LTD., Yongin-si (KR)

(72) Inventors: Byung Ju Lee, Seoul (KR); Dae Ho Song, Hwaseong-si (KR); Jin Woo Choi, Seoul (KR); Jin Wan Kim, Hwaseong-si (KR); Seung Geun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 425 days.

(21) Appl. No.: 17/583,800

(22) Filed: Jan. 25, 2022

(65) Prior Publication Data

US 2022/0352422 A1 Nov. 3, 2022

(30) Foreign Application Priority Data

Apr. 30, 2021 (KR) .................. 10-2021-0056681

(51) Int. Cl.
*H01L 33/38* (2010.01)
*H01L 33/00* (2010.01)
*H01L 33/50* (2010.01)

(52) U.S. Cl.
CPC .......... *H01L 33/382* (2013.01); *H01L 33/005* (2013.01); *H01L 33/502* (2013.01);
(Continued)

(58) Field of Classification Search
CPC . H01L 33/005; H01L 33/0093; H01L 33/382; H01L 33/42; H01L 33/44; H01L 33/50; H01L 33/502; H01L 33/504; H01L 33/505; H01L 33/62; H01L 2933/0016; H01L 2933/0041; H01L 2933/058; H01L 2933/0066; H01L 2933/0091; H01L 25/0753; H01L 25/167; H01L 27/124; H01L 27/156; G02B 5/201
See application file for complete search history.

(56) References Cited

U.S. PATENT DOCUMENTS

2019/0172874 A1* 6/2019 Lim .................. H10K 59/879
2020/0066787 A1* 2/2020 Park .................. H01L 27/156
(Continued)

FOREIGN PATENT DOCUMENTS

JP 2020-529729 A 10/2020
KR 10-2017-0084139 A 7/2017
(Continued)

*Primary Examiner* — Nelson Garces
(74) *Attorney, Agent, or Firm* — Lewis Roca Rothgerber Christie LLP

(57) ABSTRACT

A display device includes a base substrate, a partitioning wall on the base substrate, wherein the partitioning wall includes a first partitioning wall, and a second partitioning wall on the first partitioning wall, and a light emitting element spaced from the partitioning wall and located in a space surrounded by the partitioning wall in a plan view. The first partitioning wall and the light emitting element include a same material. The second partitioning wall includes a transparent conductive oxide.

20 Claims, 28 Drawing Sheets

(52) U.S. Cl.
CPC .............. *H01L 2933/0016* (2013.01); *H01L 2933/0041* (2013.01)

(56) References Cited

U.S. PATENT DOCUMENTS

2021/0043617 A1   2/2021   Onuma et al.
2022/0115564 A1   4/2022   Jeon et al.

FOREIGN PATENT DOCUMENTS

| KR | 10-2018-0059249 A | 6/2018 |
| KR | 10-2018-0118488 A | 10/2018 |
| KR | 10-2022-0049065 A | 4/2022 |

\* cited by examiner

FIG. 3
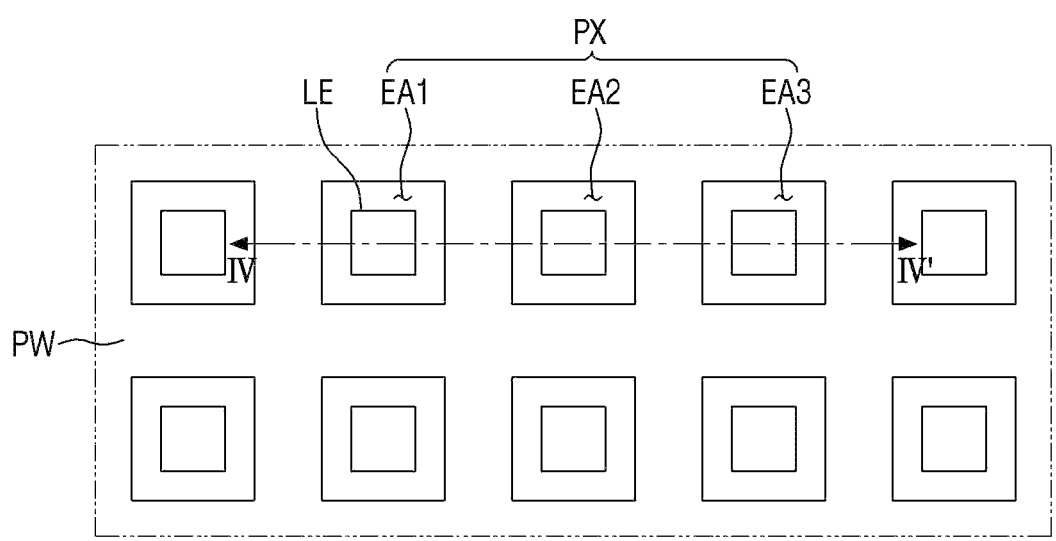
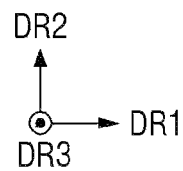

DISPLAY DEVICE INCLUDING PARTITIONING WALL COMPRISING TRANSPARENT CONDUCTIVE OXIDE AND METHOD FOR MANUFACTURING THE SAME

CROSS-REFERENCE TO RELATED APPLICATION

This application claims priority to and the benefit of Korean Patent Application No. 10-2021-0056681 filed on Apr. 30, 2021, in the Korean Intellectual Property Office (KIPO), the entire content of which is incorporated by reference herein.

BACKGROUND

1. Field

The present disclosure relates to a display device, and a method for manufacturing the display device.

2. Description of Related Art

As information society develops, demand for a display device for displaying an image is increasing in various forms. The display device may include a planarized panel display device such as a liquid crystal display device, a field emission display device, or a light-emitting display device. The light-emitting display device may include an organic light-emitting display device including an organic light-emitting diode (OLED) element as a light emitting element, an inorganic light-emitting display device including an inorganic semiconductor element as a light emitting element, or may have an ultra-small light-emitting diode or a micro light-emitting diode element as a light emitting element.

Recently, a head mounted display (HMD) including the light emitting display device is being developed. The head mounted display is a spectacle-type monitor device for virtual reality (VR) or augmented reality (AR) which is worn in a form of glasses or a helmet, and has a focal point at a position closer to user's eyes.

A high-resolution ultra-small light-emitting diode display panel including an ultra-small light-emitting diode element is applied to the head mounted display. The ultra-small light-emitting diode display panel may include a semiconductor circuit board, a light emitting element layer, and a conductive connective layer disposed between the semiconductor circuit board and the light emitting element layer.

SUMMARY

Aspects of one or more embodiments of the present disclosure provide a display device in which a top face of a light emitting element is further planarized such that a larger amount of a wavelength conversion layer is disposed in a space between partitioning walls.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a base substrate, a partitioning wall on the base substrate, wherein the partitioning wall includes a first partitioning wall, and a second partitioning wall on the first partitioning wall, and a light emitting element spaced from the partitioning wall and located in a space surrounded by the partitioning wall in a plan view. The first partitioning wall and the light emitting element include a same material. The second partitioning wall includes a transparent conductive oxide.

The partitioning wall may further includes a third partitioning wall on the second partitioning wall, wherein the third partitioning wall includes an inorganic material, and a fourth partitioning wall on the third partitioning wall, wherein the fourth partitioning wall includes a conductive material.

The second partitioning wall may include indium tin oxide (ITO).

A thickness of the second partitioning wall may be in a range of 50 nm to 100 nm.

The display device may further include a pixel electrode located between the base substrate and the light emitting element, and a connection electrode located between the light emitting element and the pixel electrode.

The display device may further include a common electrode on the light emitting element and the partitioning wall. The light emitting element may be located between the common electrode and the connection electrode.

The common electrode may be located at a top surface and a side surface of the light emitting element, and on a top surface and a side surface of the partitioning wall.

The display device may further include a common connection electrode overlapping the partitioning wall and spaced from the light emitting element.

The common connection electrode and the connection electrode may include a same material.

The light emitting element may include a first semiconductor layer on the connection electrode, an active layer on the first semiconductor layer, and a second semiconductor layer on the active layer.

The first partitioning wall may include a first sub-partitioning wall, wherein the first sub-partitioning wall and the first semiconductor layer include a same material, a second sub-partitioning wall, wherein the second sub-partitioning wall and the active layer include same material, a third sub-partitioning wall, wherein the third sub-partitioning wall and the second semiconductor layer include a same material, and a fourth sub-partitioning wall including an undoped semiconductor material.

The display device may further include a scattering layer located on the light emitting element and including scattering particles.

The display device may further include a wavelength conversion layer located on the scattering layer and including wavelength conversion particles.

The display device may further include a first light-emitting area, a second light-emitting area, and a third light-emitting area defined by the partitioning wall, a light-transmissive layer in the first light-emitting area, a first wavelength conversion layer in the second light-emitting area, and a second wavelength conversion layer in the third light-emitting area. The light-transmissive layer may transmit light of a first color therethrough. The first wavelength conversion layer may convert the light of the first color to light of a second color. The second wavelength conversion layer may convert the light of the first color to light of a third color.

The first color may be blue, the second color may be green, and the third color may be red.

According to one or more embodiments of the present disclosure, there is provided a method for manufacturing a display device, the method includes forming a material layer for a light emitting element on a base substrate, forming a planarization layer on the material layer for the light emitting element, forming a first mask pattern on the planarization layer, forming a second mask pattern on the first mask pattern, partially etching the material layer for the light emitting element and the planarization layer using the first mask pattern, removing a portion of the first mask pattern not overlapping the second mask pattern, and partially etching the planarization layer and the material layer for the light emitting element using the second mask pattern to form a light emitting element and a partitioning wall, wherein the partitioning wall is spaced from and surrounds the light emitting element. The planarization layer includes a transparent conductive oxide.

The partitioning wall may include a first partitioning wall, and a second partitioning wall located thereon. The first partitioning wall and the light emitting element may include a same material. The second partitioning wall may include the transparent conductive oxide.

The transparent conductive oxide may include indium tin oxide (ITO).

A thickness of the second partitioning wall may be in a range of 50 nm to 100 nm.

The partitioning wall may further include a third partitioning wall on the second partitioning wall, and a fourth partitioning wall on the third partitioning wall. The third partitioning wall and the first mask pattern include a same material. The fourth partitioning wall and the second mask pattern include a same material.

According to the aforementioned and other embodiments of the present disclosure, as a larger amount of the wavelength conversion layer may be disposed in a space between the partitioning walls, such that leakage of light emitting from the light emitting element may be suppressed or prevented.

BRIEF DESCRIPTION OF DRAWINGS

The above and other embodiments and features of the present disclosure will become more apparent by describing embodiments thereof with reference to the attached drawings, in which:

FIG. 3 is an enlarged view of an area B of FIG. 2;

DETAILED DESCRIPTION

Figure 1:
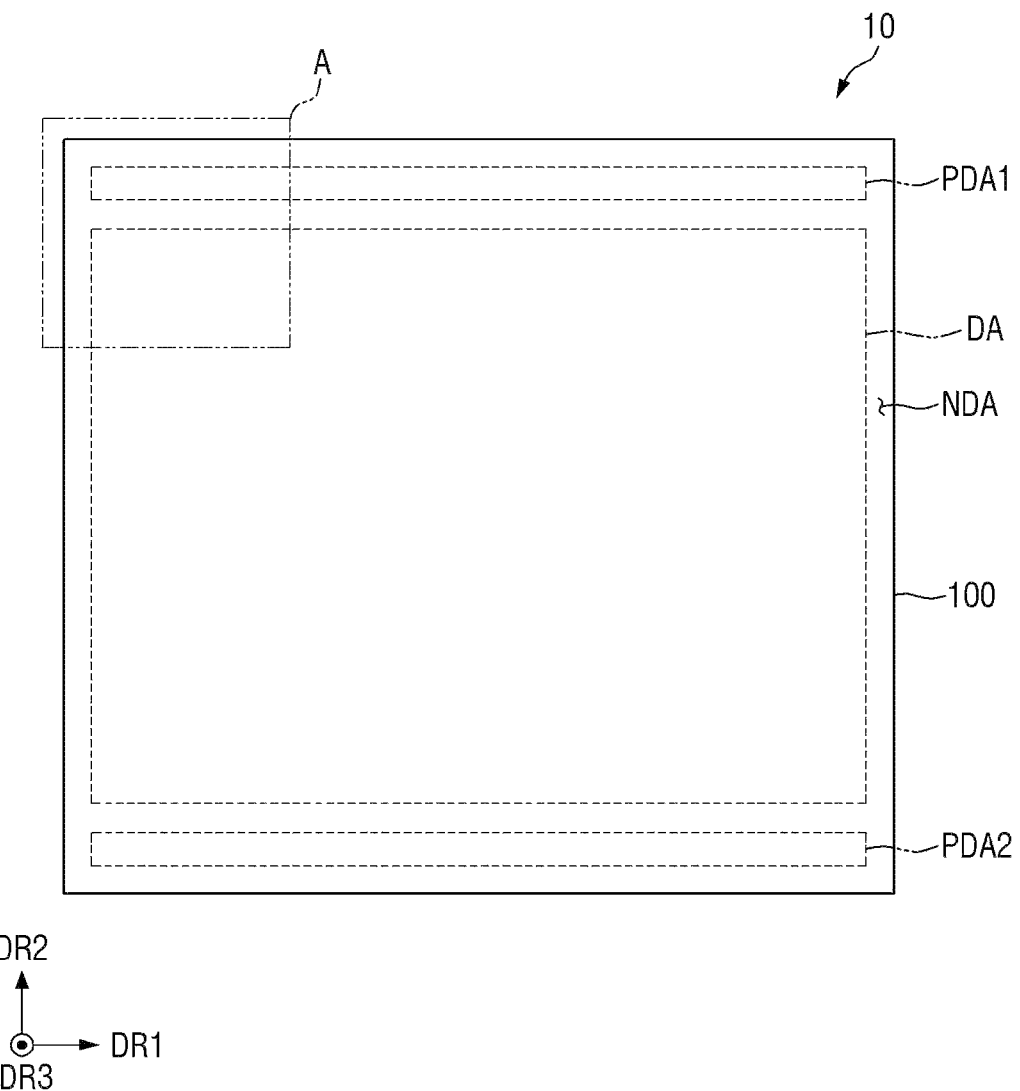
FIG. 1 is a plan view of a display device according to one or more embodiments.

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects and features of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept as well as aspects and features of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region.

Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
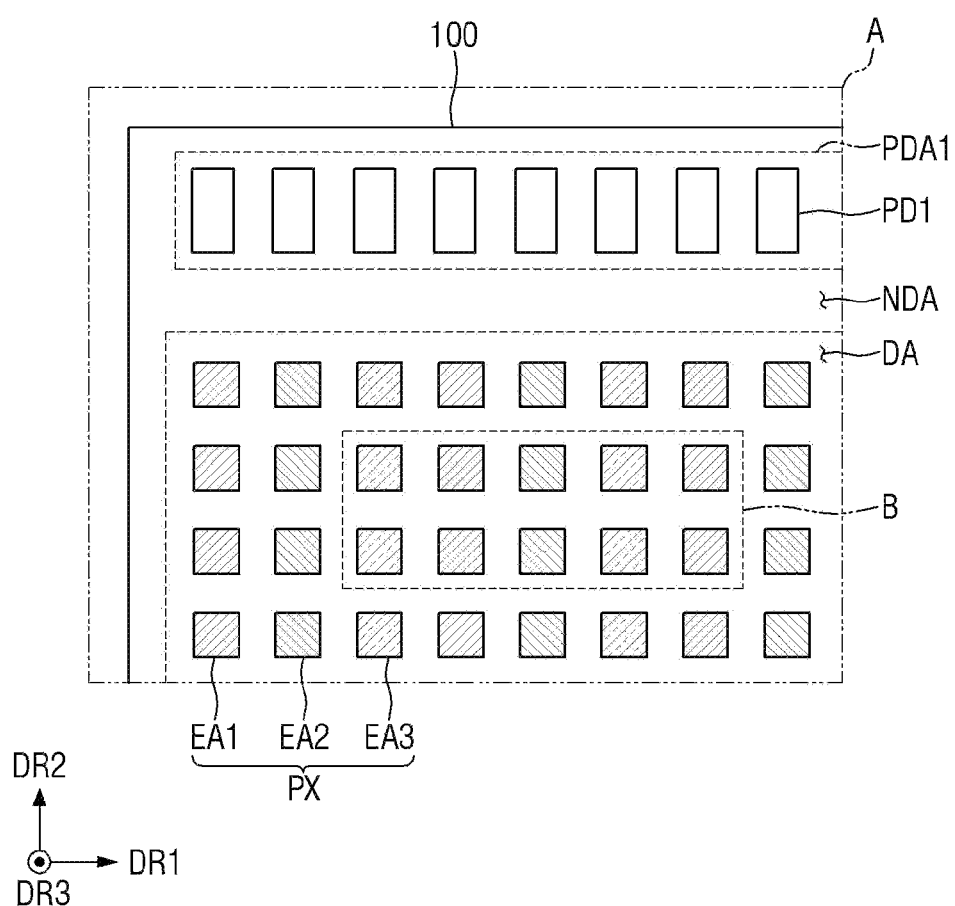
FIG. 2 is a detailed enlarged view showing an area A of FIG. 1.

FIG. 1 is a plan view of a display device according to one or more embodiments. FIG. 2 is a detailed enlarged view showing an area A of FIG. 1. FIG. 3 is an enlarged view of an area B of FIG. 2.

Figure 4:
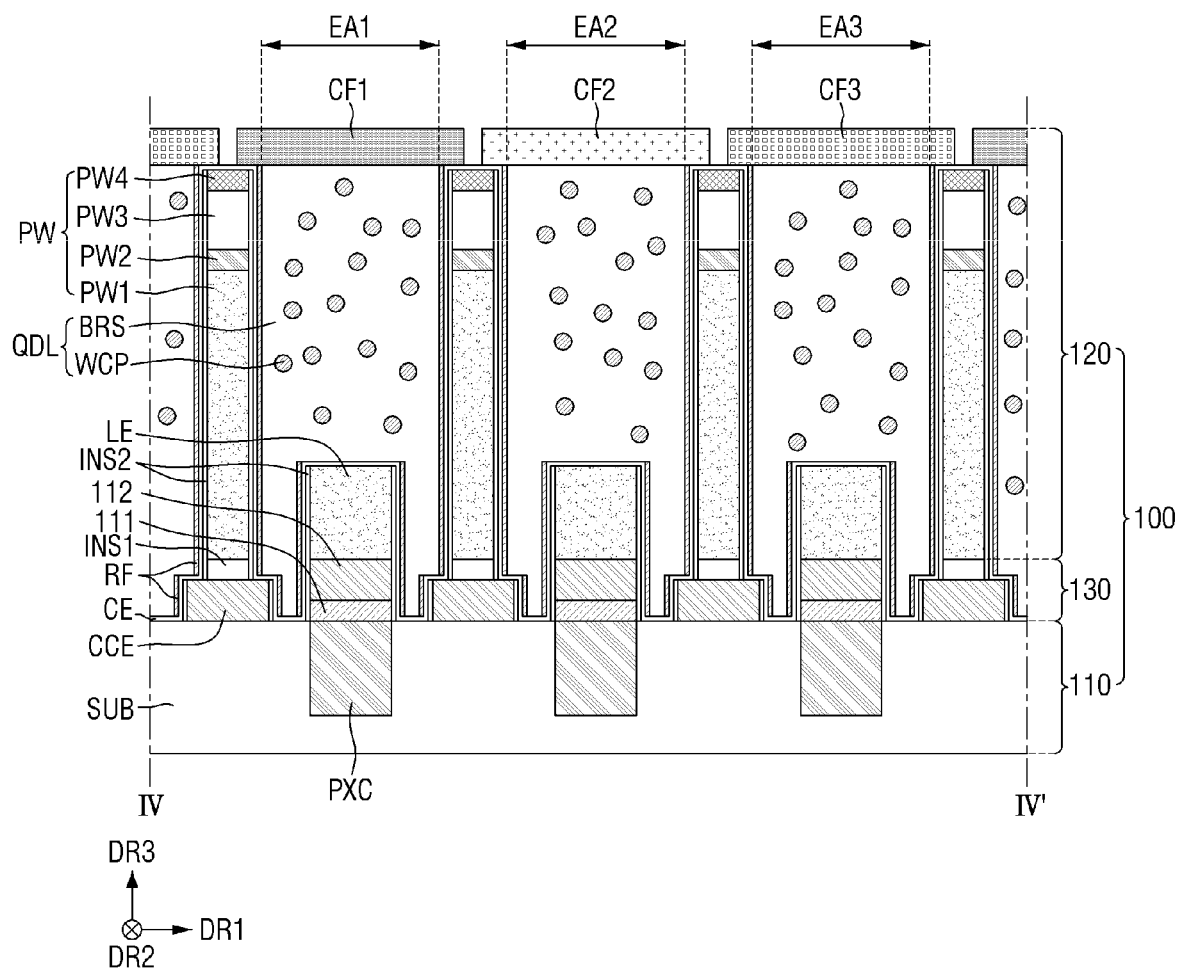
FIG. 4 is a cross-sectional view taken along the line IV-IV' in FIG. 3.

In FIG. 1-FIG. 3, a first direction DR1 indicates a longitudinal or horizontal direction of a display panel 100, a second direction DR2 indicates a transverse or vertical direction of the display panel 100, and a third direction DR3 indicates a thickness direction of the display panel 100 or a thickness direction of a semiconductor circuit board 110 (see, for example, FIG. 4). In this case, "left", "right", "upper", and "lower" indicate directions of the display panel 100 in a plan view. For example, "right" indicates one side in the first direction DR1, "left" indicates the opposite side in the first direction DR1, "upper" indicates one side in the second direction DR2, and "lower" indicates the opposite side in the second direction DR2. Further, "top" refers to one side in the third direction DR3, and "bottom" refers to the opposite side in the third direction DR3.

Referring to FIG. 1-FIG. 3, a display device 10 may refer to any electronic device that provides a display screen. For example, the display device 10 may include not only portable electronic devices such as mobile phones, smart phones, tablet personal computers (PCs), electronic watches, smart watches, watch phones, mobile communication terminals, electronic notebooks, e-books, portable multimedia players (PMPs), navigation devices, game consoles and digital cameras that provide a display screen, but also televisions, laptops, monitors, billboards, Internet of Things (IoTs), head mounted displays, and vehicle display devices that provide a display screen. A type of the display device 10 to which a technical idea of the present disclosure may be applied is not limited thereto.

The display device 10 according to one or more embodiments may have a substantially rectangular shape in a plan view. The display device 10 may have a rectangular shape having right angled corners in a plan view. However, the present disclosure is not limited thereto. The display device 10 may have a rectangular shape having rounded corners in a plan view.

Hereinafter, an example in which the display device 10 is embodied as an ultra-small light-emitting diode display device (or a micro light-emitting diode display device) including an ultra-small light-emitting diode (or a micro light-emitting diode) as a light emitting element will be described. However, embodiments of the present disclosure are not limited thereto.

Hereinafter, an example in which the display device 10 has a Light Emitting Diode on Silicon (LEDoS) structure in which light-emitting diode elements are disposed on a semiconductor circuit board 110 (see, for example, FIG. 4) formed using a semiconductor process will be described. However, the present disclosure is not limited thereto.

The display device 10 may include a display panel 100. The display panel 100 may have a rectangular planar shape having a long side in the first direction DR1 and a short side in the second direction DR2 in a plan view. However, the planar shape of the display panel 100 may not be limited thereto, but may have a polygonal shape other than the rectangular shape, or a circular, oval, or irregular planar shape.

The display panel 100 may include a display area DA in which an image is displayed and a non-display area NDA in which an image is not displayed. A planar shape of the display area DA may correspond to the planar shape of the display panel 100. The planar shape of the display area DA may include a rectangular shape. However, the present disclosure is not limited thereto. The display area DA may be disposed in an inner area of the display panel 100. The non-display area NDA may be disposed around the display area DA along the edge or periphery of the display area DA. The non-display area NDA may be disposed to surround the display area DA.

A plurality of pixels PX may be disposed in the display area DA. A pixel PX may be defined as a minimum light-emitting unit capable of displaying white light. Each of the plurality of pixels PX may include a plurality of light-emitting areas EA1, EA2, and EA3 for emitting light. In one or more embodiments of the present disclosure, it is illustrated that each of the plurality of pixels PX includes three light-emitting areas EA1, EA2, and EA3. However, the present disclosure is not limited thereto. For example, in one or more embodiments, each of the plurality of pixels PX may include four light-emitting areas.

Each of the plurality of light-emitting areas EA1, EA2, and EA3 may include a light emitting element LE for emitting first light. The light emitting element LE has been illustrated to have a rectangular planar shape. However, the present disclosure is not limited thereto. For example, the light emitting element LE may have a polygonal planar shape other than the rectangular shape, a circular planar shape, an oval planar shape, or an irregular planar shape. The light emitting element LE may emit blue light. However, the present disclosure is not limited thereto. In one or more embodiments, the light emitting element LE may emit white light.

Each of the first light-emitting areas EA1 emits the first light. Each of the first light-emitting areas EA1 may output the first light output from the light emitting element LE as it is. The first light may be light of a blue wavelength band. The blue wavelength band may be in a range of approximately 370 nm to 460 nm. However, the present disclosure is not limited thereto.

Each of the second light-emitting areas EA2 emits second light. Each of the second light-emitting areas EA2 may convert a portion of the first light output from the light emitting element LE into the second light and output the second light. The second light may be light of a green wavelength band. The green wavelength band may be in a range of approximately 480 nm to 560 nm. However, the present disclosure is not limited thereto.

Each of the third light-emitting areas EA3 emits third light. Each of the third light-emitting areas EA3 may convert a portion of the first light output from the light emitting element LE into the third light and output the same. The third light may be light of a red wavelength band. The red wavelength band may be in a range of approximately 600 nm to 750 nm. However, the present disclosure is not limited thereto.

The first light-emitting areas EA1, the second light-emitting areas EA2, and the third light-emitting areas EA3 may be alternately and repeatedly arranged with each other along the first direction DR1. For example, the first light-emitting area EA1, the second light-emitting area EA2, and the third light-emitting area EA3 may be arranged in this order along the first direction DR1.

The first light-emitting areas EA1 may be arranged along the second direction DR2. The second light-emitting areas EA2 may be arranged along the second direction DR2. The third light-emitting areas EA3 may be arranged along the second direction DR2.

A plurality of light-emitting areas EA1, EA2, and EA3 may be spaced from each other via a partitioning wall PW. The partitioning wall PW may be disposed to be around (e.g., surround) the light emitting element LE. The partitioning wall PW may be spaced from the light emitting element LE. The partitioning wall PW may have a mesh planar shape, a net planar shape, or a grid planar shape. Each of a plurality of light-emitting areas EA1, EA2, and EA3 may be defined by the partitioning wall PW. Although the drawing shows that each of the plurality of light-emitting areas EA1, EA2, and EA3 has a rectangular planar shape, the present disclosure is not limited thereto. For example, each of the plurality of light-emitting areas EA1, EA2, and EA3 may have a polygonal shape other than the rectangular shape, or a circular shape, an oval shape, or an irregular shape.

The non-display area NDA may include a first pad area PDA1 and a second pad area PDA2. The first pad area PDA1 may be disposed in an upper area of the display panel 100 in the second direction DR2. The first pad area PDA1 may include first pads PD1 connected to an external circuit board. The second pad area PDA2 may be disposed in a lower side of the display panel 100 in the second direction DR2. The second pad area PDA2 may include second pads connected to an external circuit board. In one or more embodiments, the second pad area PDA2 may be omitted.

Figure 5:
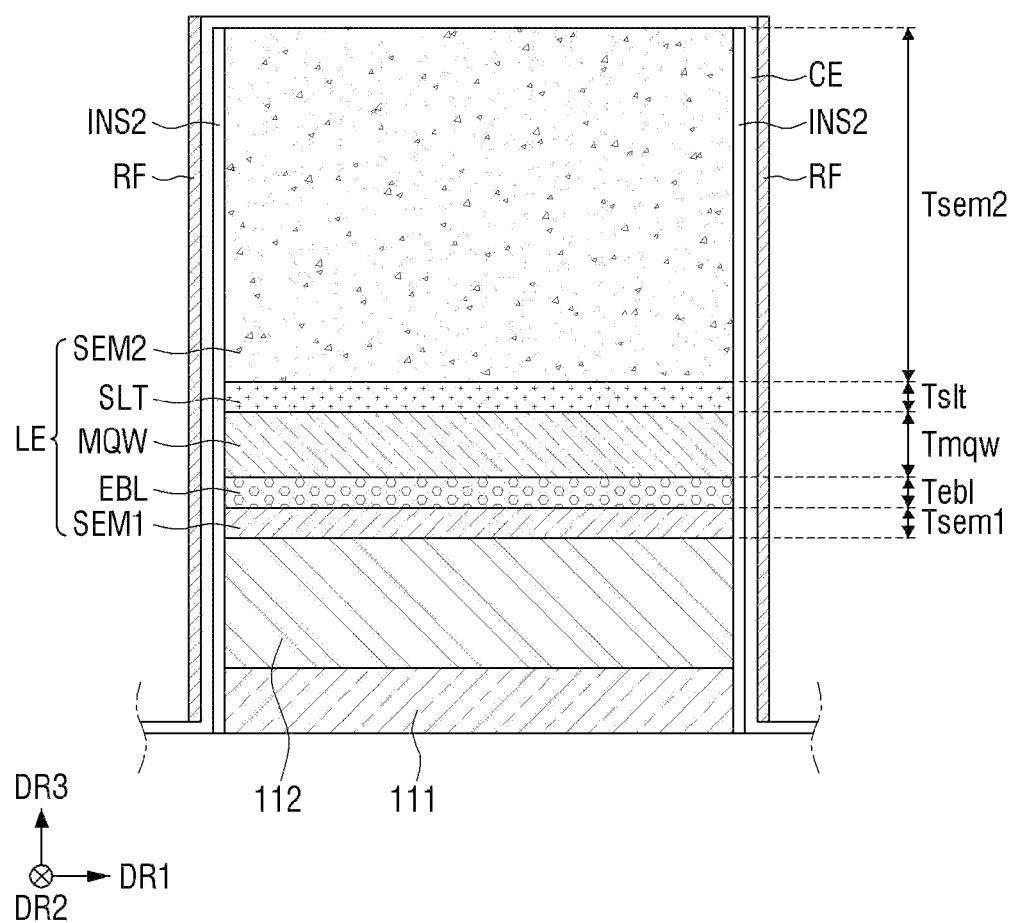
FIG. 5 is a detailed enlarged cross-sectional view showing one example of a light emitting element of FIG. 4.
Figure 6:
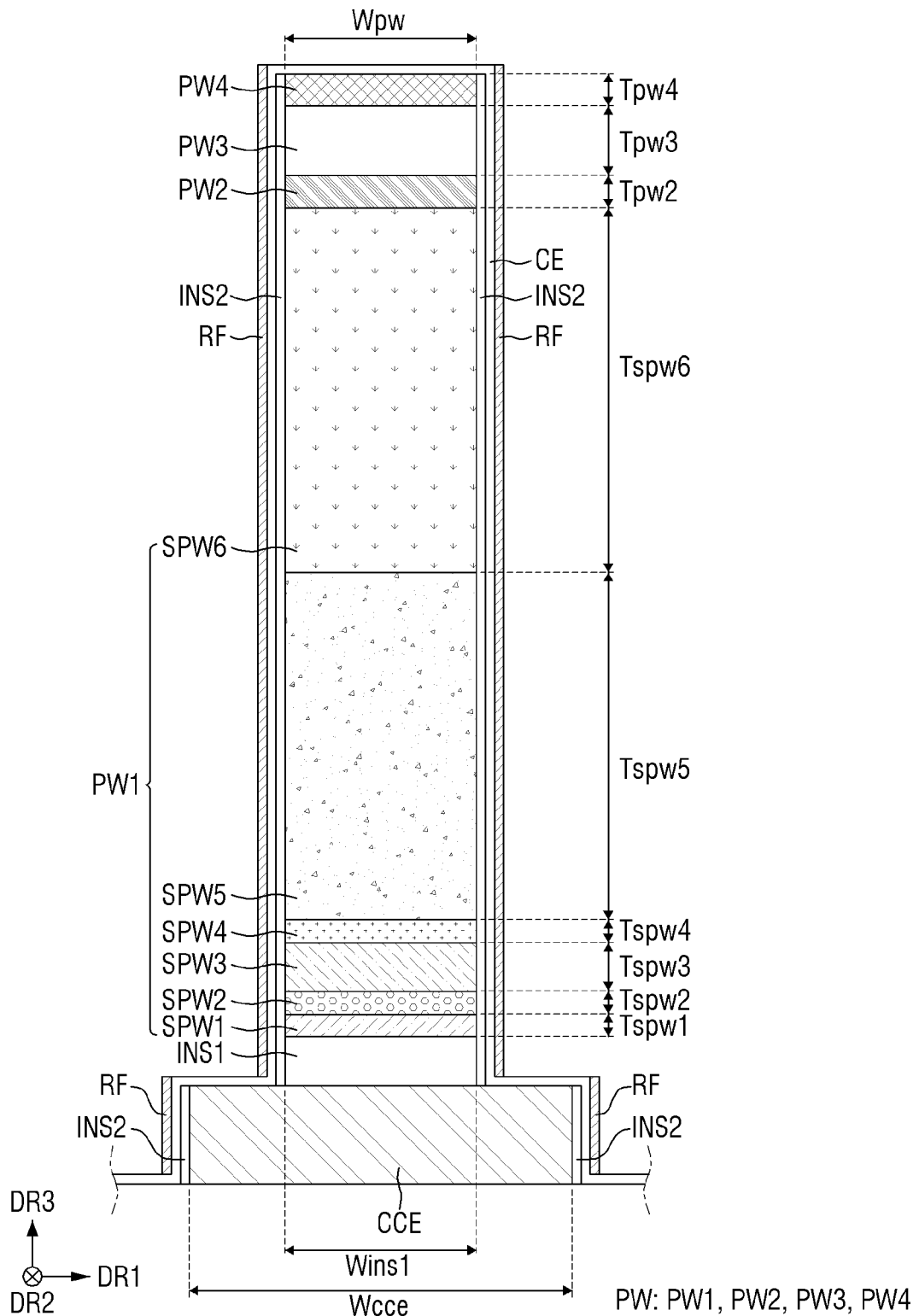
FIG. 6 is a detailed enlarged cross-sectional view showing one example of a partitioning wall of FIG. 4.

FIG. 4 is a cross-sectional view taken along the line IV-IV' in FIG. 3. FIG. 5 is a detailed enlarged cross-sectional view showing one example of a light emitting element of FIG. 4. FIG. 6 is a detailed enlarged cross-sectional view showing one example of a partitioning wall of FIG. 4.

Referring to FIG. 4-FIG. 6, the display panel 100 may include the semiconductor circuit board 110, a conductive connective layer 130, and a light emitting element layer 120.

The semiconductor circuit board 110 may include at least a base substrate SUB, a plurality of pixel circuits PXC, and pixel electrodes 111. In one or more embodiments, the pixel electrodes 111 may be included in the conductive connective layer 130. The conductive connective layer 130 may include at least connection electrodes 112, the first pads PD1 (see, for example, FIG. 2), a common connection electrode CCE, and a first insulating film INS1.

The base substrate SUB may be embodied as a silicon wafer substrate produced using a semiconductor process.

The plurality of pixel circuits PXC may be disposed in the base substrate SUB. The plurality of pixel circuits PXC may be embedded in the base substrate SUB so as not to protrude outwardly. Each of the plurality of pixel circuits PXC may include a Complementary Metal-Oxide Semiconductor (CMOS) circuit produced using a semiconductor process. The plurality of pixel circuits PXC may be disposed in a display area DA of the base substrate SUB. Each of the plurality of pixel circuits PXC may be connected to a corresponding pixel electrode 111. That is, the plurality of pixel circuits PXC and the plurality of pixel electrodes 111 may be connected to each other in a one-to-one corresponding manner. Each of the plurality of pixel circuits PXC may overlap the light emitting element LE in the third direction DR3.

Each of the plurality of pixel circuits PXC may include at least one transistor formed using a semiconductor process. Further, each of the plurality of pixel circuits PXC may further include at least one capacitor formed using a semiconductor process. Each of the plurality of pixel circuits PXC may apply a pixel voltage or an anode voltage to each pixel electrode 111.

Each of the pixel electrodes 111 may be disposed on a corresponding pixel circuit PXC. Each of the pixel electrodes 111 may act as an exposed portion of each pixel circuit PXC. That is, each of the pixel electrodes 111 may protrude from a top face (e.g., a top surface) of the pixel circuit PXC and outwardly of the substrate SUB. Each of the pixel electrodes 111 may be integrally formed with the pixel circuit PXC. Each of the pixel electrodes 111 may receive a pixel voltage or an anode voltage from a corresponding pixel circuit PXC. Each of the pixel electrodes 111 may be made of aluminum (Al).

Each of the connection electrodes 112 may be disposed on each pixel electrode 111 corresponding thereto. Each of the connection electrodes 112 may be disposed on each pixel electrode 111. Each of the connection electrodes 112 may include a metal material for bonding each of the pixel electrodes 111 and each of the light emitting element LE to each other. For example, each of the connection electrodes 112 may include at least one of gold (Au), copper (Cu), aluminum (Al), and tin (Sn). Alternatively, each of the connection electrodes 112 may have a first layer including one of gold (Au), copper (Cu), aluminum (Al), and tin (Sn), and a second layer including another one of gold (Au), copper (Cu), aluminum (Al), and tin (Sn). In this case, the second layer may be disposed on the first layer.

The common connection electrode CCE may be spaced from the pixel electrodes 111 and the connection electrodes 112 in the first direction DR1. The common connection electrode CCE may be disposed to be around (e.g., surround) the pixel electrodes 111 and the connection electrodes 112.

The common connection electrode CCE may be connected to one of the first pads PD1 of the first pad area PDA1 of the non-display area NDA (see, for example, FIG. 2) or one of the second pads of the second pad area PDA2 of the non-display area NDA to receive a common voltage. The common connection electrode CCE may include the same material as that of each of the connection electrodes 112. For example, the common connection electrode CCE may include at least one of gold (Au), copper (Cu), aluminum (Al), and tin (Sn). When each of the connection electrodes 112 includes the first layer and the second layer, the common connection electrode CCE may include the same material as that of the first layer of each of the connection electrodes 112.

The first insulating film INS1 may be disposed on the common connection electrode CCE. The first insulating film INS1 may be embodied as an inorganic film such as a silicon oxide film (SiO2 film), an aluminum oxide film (Al2O3 film), or a hafnium oxide film (HfOx film). A width Wins1 (see, for example, FIG. 6) of the first insulating film INS1 in the first direction DR1 or the second direction DR2 may be smaller than a width Wcce (see, for example, FIG. 6) of the common connection electrode CCE in the first direction DR1 or the second direction DR2. Thus, a portion of a top face (e.g., the top surface) of the common connection electrode CCE may be exposed while not being covered with the first insulating film INS1. The exposed portion of the top face (e.g., the top surface) of the common connection electrode CCE uncovered with the first insulating film INS1 may contact a common electrode CE. Therefore, the common electrode CE may be connected to the common connection electrode CCE.

Each of the first pads PD1 may be connected to a pad of a circuit board via a conductive connecting member such as each wire corresponding thereto. That is, the first pads PD1, the wires, and the pads of the circuit board may be connected to each other in a one-to-one manner.

Each of the first pads PD1 may include a first pad electrode and a second pad electrode. The first pad electrode may include the same material as that of the pixel electrode 111. The second pad electrode may include the same material as that of the connection electrodes 112. For example, the second pad electrode may include at least one of gold (Au), copper (Cu), aluminum (Al), and tin (Sn). When each of the connection electrodes 112 includes the first layer and the second layer, the second pad electrode may also include a first layer and a second layer.

The semiconductor circuit board 110 and the circuit board may be disposed on the base substrate BSUB. The semiconductor circuit board 110 and the circuit board may be attached to a top face (e.g., a top surface) of the base substrate BSUB using an adhesive member such as a pressure sensitive adhesive (PSA).

The circuit board may be embodied as a flexible film such as a flexible printed circuit board (FPCB), a printed circuit board (PCB), a flexible printed circuit (FPC) or a chip on film (COF).

In one example, each of the second pads of the second pad area PDA2 may be substantially the same as the first pad PD1 as described in conjunction with FIGS. 3, 4, and 5. Thus, a description thereof is omitted.

The light emitting element layer 120 may include the light emitting elements LE, the partitioning wall PW, a second insulating film INS2, the common electrode CE, a reflective film RF, a wavelength conversion layer QDL, and a plurality of color filters CF1, CF2, and CF3.

The light emitting element layer 120 may include the first light-emitting area EA1, the second light-emitting area EA2, and the third light-emitting area EA3 partitioned from each other via the partitioning wall PW. Each of the first light-emitting area EA1, the second light-emitting area EA2, and the third light-emitting area EA3 may include the light emitting element LE, the wavelength conversion layer QDL, and the plurality of color filters CF1, CF2, and CF3.

The light emitting element LE may be disposed on the connection electrode 112 in each of the first light-emitting area EA1, the second light-emitting area EA2, and the third light-emitting area EA3. The light emitting element LE may be a vertical type light-emitting diode element extending in the third direction DR3. That is, a length in the third direction DR3 of the light emitting element LE may be larger than a length in a horizontal direction thereof. The length in the horizontal direction indicates a length in the first direction DR1 or a length in the second direction DR2. For example, the length in the third direction DR3 of the light emitting element LE may be in a range of approximately 1 to 5 µm.

The light emitting element LE may be embodied as a micro light-emitting diode element. The light emitting element LE may include a first semiconductor layer SEM1, an electron blocking layer EBL, an active layer MQW, a superlattice layer SLT, and a second semiconductor layer SEM2 that are arranged along the third direction DR3, as shown in FIG. 5. The first semiconductor layer SEM1, the electron blocking layer EBL, the active layer MQW, the superlattice layer SLT, and the second semiconductor layer SEM2 may be sequentially stacked in the third direction DR3.

The first semiconductor layer SEM1 may be disposed on the connection electrode 112. The first semiconductor layer SEM1 may be doped with a first conductivity type dopant such as Mg, Zn, Ca, Se, or Ba. For example, the first semiconductor layer 31 may be made of p-GaN doped with p-type Mg. A thickness of the first semiconductor layer 31 may be in a range of approximately 30 to 200 nm.

The electron blocking layer EBL may be disposed on the first semiconductor layer SEM1. The electron blocking layer EBL may function to inhibit or prevent excessive electrons from flowing into the active layer MQW. For example, the electron blocking layer EBL may be made of p-AlGaN doped with p-type Mg. A thickness of the electron blocking layer EBL may be in a range of approximately 10 to 50 nm. In one or more embodiments, the electron blocking layer EBL may be omitted.

The active layer MQW may be disposed on the electron blocking layer EBL. The active layer MQW may emit light via electron-hole combination when an electric signal is applied through the first semiconductor layer SEM1 and the second semiconductor layer SEM2. The active layer MQW may emit first light having a central wavelength band in a range of 450 nm to 495 nm, that is, light of a blue wavelength band.

The active layer MQW may include a material having a single or multi quantum well structure. When the active layer MQW includes a material having a multi-quantum well structure, a plurality of well layers and a plurality of barrier layers may be alternately stacked one on top of another. In this connection, the well layer may be made of InGaN, and the barrier layer may be made of GaN or AlGaN. However, the present disclosure is not limited thereto. A thickness of the well layer may be in a range of approximately 1 to 4 nm, and a thickness of the barrier layer may be in a range of approximately 3 to 10 nm.

Alternatively, the active layer MQW may have a structure in which a semiconductor material having a large bandgap energy and a semiconductor material having a small bandgap energy are alternately stacked one on top of another. The active layer MQW may include Groups III to V semiconductor materials depending on a wavelength band of light emitting therefrom. The light emitting from the active layer MQW is not limited to the first light (e.g., light having blue wavelength band). In some cases, the light emitted from the active layer MQ may be the second light (e.g., light having a green wavelength band) or third light (e.g., light having a red wavelength band).

The superlattice layer SLT may be disposed on the active layer MQW. The superlattice layer SLT may function to relieve stress between the second semiconductor layer SEM2 and the active layer MQW. For example, the superlattice layer SLT may be made of InGaN or GaN. A thickness of the superlattice layer SLT may be in a range of approximately 50 to 200 nm. In one or more embodiments, the superlattice layer SLT may be omitted.

The second semiconductor layer SEM2 may be disposed on the superlattice layer SLT. The second semiconductor layer SEM2 may be doped with a second conductivity type dopant such as Si, Ge, or Sn. For example, the second semiconductor layer SEM2 may be made of n-GaN doped with n-type Si. A thickness of the second semiconductor layer SEM2 may be in a range of about 2 to 4 μm.

The partitioning wall PW may be spaced from the light emitting element LE disposed in each of the first light-emitting area EA1, the second light-emitting area EA2, and the third light-emitting area EA3 in the first direction DR1 or the second direction DR2. The partitioning wall PW may be disposed to be around (e.g., surround) the light emitting element LE disposed in each of the first light-emitting area EA1, the second light-emitting area EA2, and the third light-emitting area EA3.

The partitioning wall PW may be disposed on the common connection electrode CCE. The width Wpw of the partitioning wall PW in each of the first direction DR1 and the second direction DR2 may be smaller than the width Wcce of the common connection electrode CCE in each of the first direction DR1 and the second direction DR2. The partitioning wall PW may be spaced from the light emitting elements LE in the first direction DR1 or the second direction DR2.

The partitioning wall PW may include a first partitioning wall PW1, a second partitioning wall PW2, a third partitioning wall PW3, and a fourth partitioning wall PW4.

The first partitioning wall PW1 may be disposed on the first insulating film INS1. In one or more embodiments, the first partitioning wall PW1 may be disposed on a conductive pattern. The first partitioning wall PW1 may be formed using the same process which may be used to form the light emitting element LE. Thus, at least a portion of an area of the first partitioning wall PW1 may include the same material as that of the light emitting element LE.

The first partitioning wall PW1 may include a plurality of sub-partitioning walls SPW1 to SPW6 sequentially stacked in the third direction DR3. For example, the first partitioning wall PW1 may include a first sub-partitioning wall SPW1, a second sub-partitioning wall SPW2, a third sub-partitioning wall SPW3, a fourth sub-partitioning wall SPW4, a fifth sub-partitioning wall SPW5, and a sixth sub-partitioning wall SPW6.

The first sub-partitioning wall SPW1 may be made of the same material as that of the first semiconductor layer SEM1 of the light emitting element LE. The first sub-partitioning wall SPW1 may be formed using the same process which may be used to form the first semiconductor layer SEM1 of the light emitting element LE. A thickness Tspw1 of the first sub-partitioning wall SPW1 may be substantially equal to a thickness Tsem1 of the first semiconductor layer SEM1 of the light emitting element LE in the third direction DR3.

The second sub-partitioning wall SPW2 may be made of the same material as that of the electron blocking layer EBL of the light emitting element LE. The second sub-partitioning wall SPW2 may be formed using the same process which may be used to form the electron blocking layer EBL of the light emitting element LE. A thickness Tspw2 of the second sub-partitioning wall SPW2 may be substantially equal to a thickness Tebl of the electron blocking layer EBL of the light emitting element LE in the third direction DR3. When the electron blocking layer EBL is omitted, the second sub-partitioning wall SPW2 may also be omitted.

The third sub-partitioning wall SPW3 may be made of the same material as that of the active layer MQW of the light emitting element LE. The third sub-partitioning wall SPW3 may be formed using the same process which may be used to form the active layer MQW of the light emitting element LE. A thickness Tspw3 of the third sub-partitioning wall SPW3 may be substantially equal to a thickness Tmqw of the active layer MQW of the light emitting element LE in the third direction DR3.

The fourth sub-partitioning wall SPW4 may be made of the same material as that of the superlattice layer SLT of the light emitting element LE. The fourth sub-partitioning wall SPW4 may be formed using the same process which may be used to form the superlattice layer SLT of the light emitting element LE. A thickness Tspw4 of the fourth sub-partitioning wall SPW4 may be substantially equal to a thickness Tslt of the superlattice layer SLT of the light emitting element LE in the third direction DR3.

The fifth sub-partitioning wall SPW5 may be made of the same material as that of the second semiconductor layer SEM2 of the light emitting element LE. The fifth sub-partitioning wall SPW5 may be formed using the same process which may be used to form the second semiconductor layer SEM2 of the light emitting element LE. In a manufacturing process of the display panel 100, the fifth sub-partitioning wall SPW5 may not be removed, but a portion of the second semiconductor layer SEM2 of the light emitting element LE may be removed. Thus, a thickness Tspw5 of the fifth sub-partitioning wall SPW5 may be larger than a thickness Tsem2 of the second semiconductor layer SEM2 of the light emitting element LE in the third direction DR3.

The sixth sub-partitioning wall SPW6 may be embodied as a semiconductor layer not doped with a dopant, that is, an undoped semiconductor layer. For example, the sixth sub-partitioning wall SPW6 may be made of GaN undoped with a dopant. A thickness Tspw6 of the sixth sub-partitioning wall SPW6 may be greater than the thickness Tsem2 of the second semiconductor layer SEM2 of the light emitting element LE in the third direction DR3. The thickness Tspw6 of the sixth sub-partitioning wall SPW6 may be in a range of approximately 2 to 3 μm.

The second partitioning wall PW2 may be disposed on the first partitioning wall PW1. The second partitioning wall PW2 may include a transparent conductive oxide (TCO). The second partitioning wall PW2 may include, for example, at least one selected from indium tin oxide (ITO), and indium zinc oxide (IZO), etc. However, the present disclosure is not limited thereto.

The thickness Tpw2 of the second partitioning wall PW2 may be within a range of 1 nm to 1000 nm, or may be within a range of 50 nm to 100 nm. However, the present disclosure is not limited thereto. When the thickness Tpw2 of the second partitioning wall PW2 or a thickness of a planarization layer FL (see FIG. 10 and FIG. 11) satisfies the above range, the planarization layer FL (see FIG. 10 and FIG. 11) disposed on the light emitting element LE may be more easily etched, and damage to the partitioning wall PW due to the etching of the planarization layer FL (see FIG. 10 and FIG. 11) may be suppressed or prevented.

Figure 10:
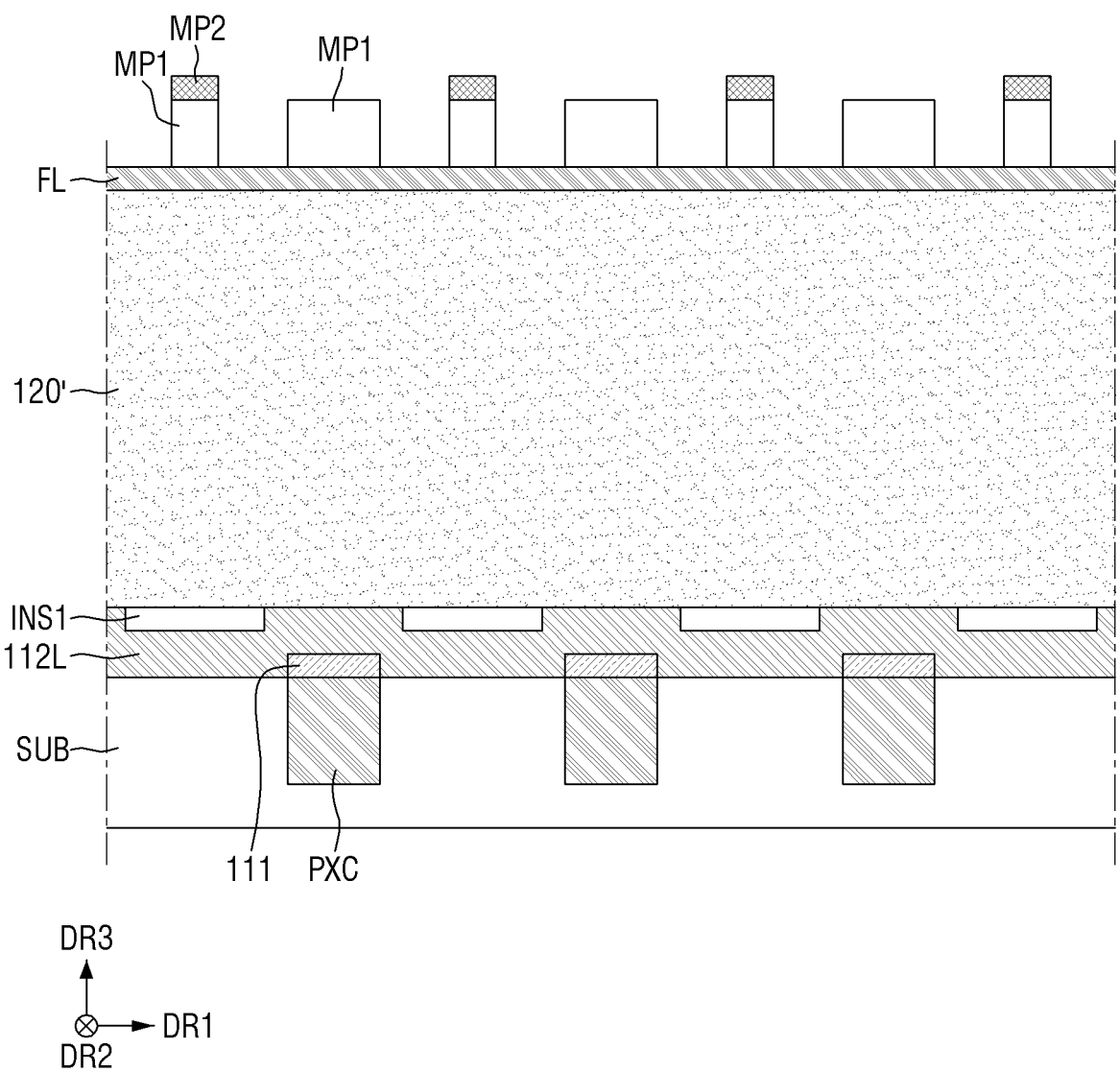
Figure 11:
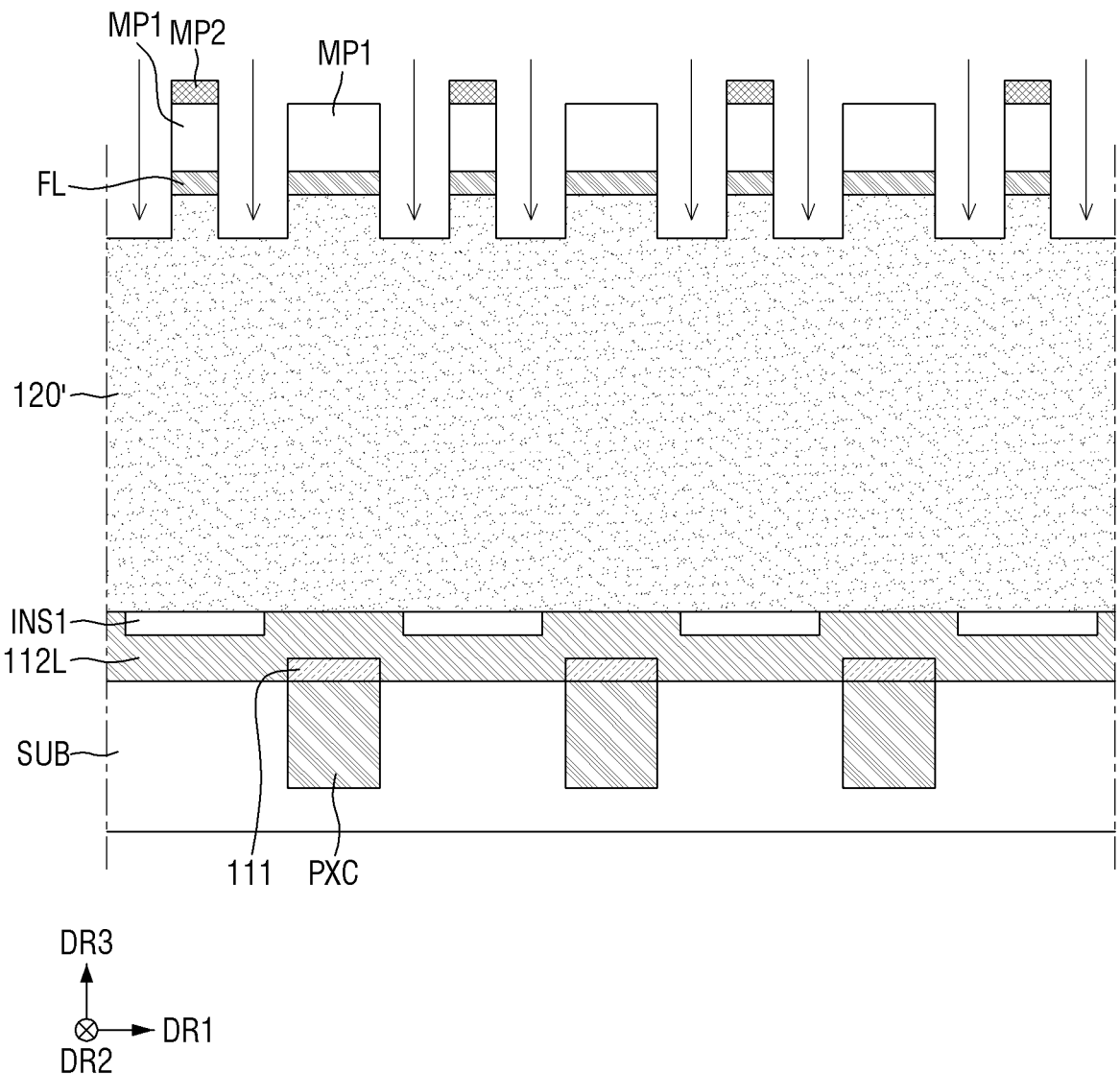

The second partitioning wall PW2 may be formed by etching the planarization layer FL (see FIG. 10 and FIG. 11). A detailed description thereof will be described later.

The third partitioning wall PW3 and the fourth partitioning wall PW4 may serve as a mask to prevent the first partitioning wall PW1 from being etched in a manufacturing process to form the light emitting element LE and the partitioning wall PW.

The third partitioning wall PW3 may be disposed on the second partitioning wall PW2. The third partitioning wall PW3 may include an inorganic film such as a silicon oxide film (SiO2 film), an aluminum oxide film (Al2O3 film), or a hafnium oxide film (HfOx film). A thickness Tpw3 of the third partitioning wall PW3 may be in a range of approximately 1 to 2 μm.

The fourth partitioning wall PW4 may be disposed on the third partitioning wall PW3. The fourth partitioning wall PW4 may include a conductive material such as nickel (Ni). A thickness Tpw4 of the fourth partitioning wall PW4 may be in a range of approximately 0.01 to 1 μm.

The second insulating film INS2 may be disposed on side faces (e.g., side surfaces) of the common connection electrode CCE, side faces (e.g., side surfaces) of the partitioning wall PW, side faces (e.g., side surfaces) of each of the pixel electrodes 111, side faces (e.g., side surfaces) of each of the connection electrodes 112, and side faces (e.g., side surfaces) of each of the light emitting elements LE. The second insulating film INS2 may be embodied as an inorganic film such as a silicon oxide film (SiO2 film), an aluminum oxide film (Al2O3 film), or a hafnium oxide film (HfOx film). A thickness of the second insulating film INS2 may be approximately 0.1 μm.

The common electrode CE may be disposed on a top face (e.g., a top surface) and side faces (e.g., side surfaces) of each of the light emitting elements LE, and a top face (e.g., a top surface) and side faces (e.g., side surfaces) of the partitioning wall PW. That is, the common electrode CE may cover the top face (e.g., the top surface) and the side faces (e.g., the side surfaces) of each of the light emitting elements LE, and the top face (e.g., the top surface) and the side faces (e.g., the side surfaces) of the partitioning wall PW. The common electrode CE may contact the second insulating film INS2 disposed on the side faces (e.g., the side surfaces) of the common connection electrode CCE, the side faces (e.g., the side surfaces) of the partitioning wall PW, the side faces (e.g., the side surfaces) of each of the pixel electrodes 111, the side faces (e.g., the side surfaces) of each of the connection electrodes 112, and the side faces (e.g., the side surfaces) of each of the light emitting elements LE. Further, the common electrode CE may contact the top face (e.g., the top surface) of the common connection electrode CCE, the top face (e.g., the top surface) of each of the light emitting elements LE, and the top face (e.g., the top surface) of the partitioning wall PW.

The common electrode CE may be in contact with the top face (e.g., the top surface) of the common connection electrode CCE and the top face (e.g., the top surface) of the light emitting element LE that are not covered with the second insulating film INS2. Therefore, the common voltage supplied to the common connection electrode CCE may be applied to the light emitting element LE. That is, one end of the light emitting element LE may receive the pixel voltage or the anode voltage of the pixel electrode 111 via the connection electrode 112, while the opposite end thereof may receive the common voltage via the common electrode CE. The light emitting element LE may emit light at a desired (e.g., set or predefined) luminance level based on a voltage difference between the pixel voltage and the common voltage.

The common electrode CE may include a transparent conductive material. The common electrode CE may be made of a transparent conductive oxide (TCO) such as Indium Tin Oxide(ITO) or Indium Zinc Oxide(IZO). A thickness of the common electrode CE may be approximately 0.1 μm.

The reflective film RF may play a role of reflecting light beams that travel not in the third direction DR3 but in each of the first and second directions from among light beams emitting from the light emitting element LE. The reflective film RF may include a highly reflective metal material such as aluminum (Al). A thickness of the reflective film RF may be approximately 0.1 μm.

The reflective film RF may be disposed on the side faces (e.g., the side surfaces) of the common connection electrode CCE, the side faces (e.g., the side surfaces) of the partitioning wall PW, the side faces (e.g., the side surfaces) of each of the pixel electrodes 111, the side faces (e.g., the side surfaces) of each of the connection electrodes 112, and the side faces (e.g., the side surfaces) of each of the light emitting elements LE. The reflective film RF may contact the common electrode CE disposed on the side faces (e.g., the side surfaces) of the common connection electrode CCE, the side faces (e.g., the side surfaces) of the partitioning wall PW, the side faces (e.g., the side surfaces) of each of the pixel electrodes 111, the side faces (e.g., the side surfaces) of each of the connection electrodes 112, and the side faces (e.g., the side surfaces) of each of the light emitting elements LE.

The wavelength conversion layer QDL may be disposed in a space around (e.g., surrounded with) the partitioning wall PW in a plan view, and may fill the space partitioned by the partitioning wall PW. The wavelength conversion layer QDL may be disposed on the light emitting element LE and in each of the first light-emitting area EA1, the second light-emitting area EA2, and the third light-emitting area EA3. The wavelength conversion layer QDL may convert a portion of the first light emitting from the light emitting element LE into fourth light and output the fourth light. For example, the fourth light may be light of a yellow wavelength band. The fourth light may be light including both a green wavelength band and a red wavelength band. That is, the fourth light may be a mixture of the second light and the third light.

The wavelength conversion layer QDL may include a base resin BRS and wavelength conversion particles WCP. The base resin BRS may include a light-transmissive organic material. For example, the base resin BRS may include epoxy resin, acrylic resin, cardo resin, or imide resin. The base resin BRS may include a light-transmissive organic material. For example, the base resin BRS may include epoxy resin, acrylic resin, cardo resin, or imide resin. The base resin BRS may be UV-curable or heat-curable resin.

The wavelength conversion particles WCP may convert the first light incident from the light emitting element LE to the fourth light. For example, the wavelength conversion particles WCP may convert light of a blue wavelength band into light of a yellow wavelength band. The wavelength conversion particle WCP may include a quantum dot (QD), a quantum rod, a fluorescent material, or a phosphorescent material. The quantum dot may include Group IV nanocrystals, Group II-VI compound nanocrystals, Group III-V compound nanocrystals, Group IV-VI nanocrystals, or a combination thereof.

The quantum dot may include a core and a shell coated on and surrounding the core. For example, the core may include at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge. However, the present disclosure is not limited thereto. The shell may include, but may not be limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

The wavelength conversion layer QDL may further include scattering particles to scatter the light from the light emitting element LE in random directions. In this case, the scattering particles may include metal oxide particles or organic particles. For example, the metal oxide particle may include titanium oxide ($TiO_2$), zirconium oxide ($ZrO_2$), aluminum oxide ($Al_2O_3$), indium oxide ($In_2O_3$), zinc oxide (ZnO) or tin oxide ($SnO_2$). Further, the organic particle may include acrylic resin or urethane resin. A diameter of the scattering particles may be in a range of several to several tens of nanometers.

The plurality of color filters CF1, CF2, and CF3 may include first color filters CF1, second color filters CF2, and third color filters CF3. Each of the first color filters CF1 may be disposed on the wavelength conversion layer QDL and in the first light-emitting area EA1. Further, each of the first color filters CF1 may be disposed on the partitioning wall PW. Each of the first color filters CF1 may transmit the first light therethrough and absorb or block the fourth light. For example, each of the first color filters CF1 may transmit light of a blue wavelength band therethrough, and absorb or block light of each of green and red wavelength bands. Therefore, each of the first color filters CF1 may transmit therethrough a portion of the first light emitting from the light emitting element LE that is not converted into the fourth light by the wavelength conversion layer QDL and may absorb or block the fourth light which the wavelength conversion layer QDL converts a remaining portion of the first light emitting from the light emitting element LE into. Accordingly, each of the first light-emitting areas EA1 may emit the first light.

Each of the second color filters CF2 may be disposed on the wavelength conversion layer QDL and in the second light-emitting area EA2. Further, each of the second color filters CF2 may be disposed on the partitioning wall PW. Each of the second color filters CF2 may transmit the second light therethrough and absorb or block the first light and the third light. For example, each of the second color filters CF2 may transmit light of a green wavelength band therethrough, and absorb or block light of each of blue and red wavelength bands. Therefore, each of the second color filters CF2 may absorb or block a portion of the first light emitting from the light emitting element LE that is not converted into the fourth light by the wavelength conversion layer QDL. Further, each of the second color filter CF2 may transmit therethrough the second light corresponding to the green wavelength band from the fourth light into which the wavelength conversion layer QDL convert a portion of the first light, and may absorb or block the third light corresponding to the red wavelength band from the fourth light. Accordingly, each of the second light-emitting areas EA1 may emit the second light.

Each of the third color filters CF3 may be disposed on the wavelength conversion layer QDL and in the third light-emitting area EA3. Further, each of the third color filters CF3 may be disposed on the partitioning wall PW. Each of the third color filters CF3 may transmit the third light therethrough and absorb or block the first light and the second light. For example, each of the third color filters CF3 may transmit light of a red wavelength band therethrough, and absorb or block light of a blue and green wavelength band. Therefore, each of the third color filters CF3 may absorb or block a portion of the first light emitting from the light emitting element LE that is not converted into the fourth light by the wavelength conversion layer QDL. Further, each of the third color filters CF3 may transmit therethrough the third light corresponding to the red wavelength band from the fourth light into which the wavelength conversion layer QDL converts a portion of the first light, and may absorb or block the second light corresponding to the green wavelength band from the fourth light. Accordingly, each of the third light-emitting areas EA3 may emit the third light.

Figure 7:
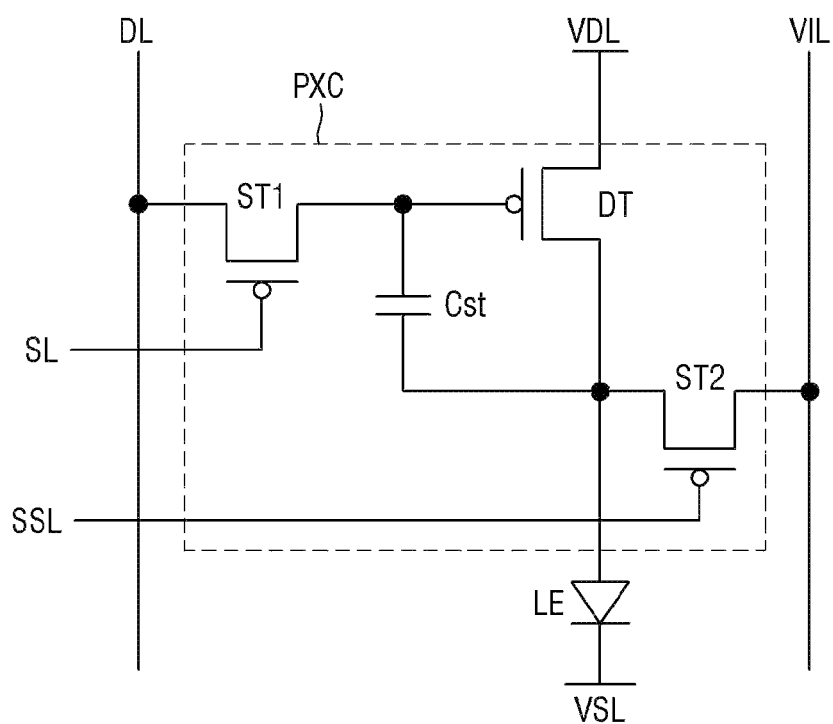
FIG. 7 is a circuit diagram of a pixel circuit and a light emitting element according to one or more embodiments.

FIG. 7 is a circuit diagram of a pixel circuit and a light emitting element according to one or more embodiments.

FIG. 7 shows one example of the pixel circuit PXC and the light emitting element LE of FIG. 4.

Referring to FIG. 7, the light emitting element LE emits light under a drive current. An emission amount of the light emitting element LE may be proportional to an amount of the drive current. The light emitting element LE may be embodied as an inorganic light emitting element including an anode, a cathode, and an inorganic semiconductor disposed between the anode and the cathode. For example, the light emitting element LE may be embodied as a micro light-emitting diode.

The anode of the light emitting element EL may be connected to a source electrode of a driving transistor DT, while the cathode may be connected to a second power line VSL to which a low-potential voltage that is lower than a high-potential voltage is supplied.

The driving transistor DT adjusts a current flowing from a first power line VDL to which a first power voltage is supplied to the light emitting element EL based on a difference between voltages of a gate electrode and a source electrode of the driving transistor DT thereof. The gate electrode of the driving transistor DT may be connected to a first electrode of a first transistor ST1, the source electrode thereof may be connected to the anode of the light emitting element EL, and a drain electrode thereof may be connected to the first power line VSL to which the high-potential voltage is applied.

The first transistor ST1 is turned on based on a scan signal (e.g., a low-level scan signal) of a scan line SL to connect a data line DL to the gate electrode of the driving transistor DT. A gate electrode of the first transistor ST1 may be connected to the scan line SL, the first electrode thereof may be connected to the gate electrode of the driving transistor DT, and a second electrode thereof may be connected to the data line DL.

A second transistor ST2 is turned on based on a sensing signal (e.g., a low-level sensing signal) of a sensing signal line SSL to connect an initialization voltage line VIL to the source electrode of the driving transistor DT. A gate electrode of the second transistor ST2 may be connected to the sensing signal line SSL, a first electrode thereof may be connected to the initialization voltage line VIL, and a second electrode thereof may be connected to the source electrode of the driving transistor DT.

The first electrode of each of the first and second transistors ST1 and ST2 may act as a source electrode, while the second electrode thereof may act as a drain electrode. It should be noted that the present disclosure is not limited thereto. That is, the first electrode of each of the first and second transistors ST1 and ST2 may act as a drain electrode, while the second electrode thereof may act as a source electrode.

A capacitor Cst is disposed between the gate electrode and the source electrode of the driving transistor DT. The capacitor Cst stores therein a voltage difference between the gate voltage and the source voltage of the driving transistor DT.

The above description is based on an example in which each of the driving transistor DT and the first and second transistors ST1 and ST2 is embodied as a P-type Metal Oxide Semiconductor Field Effect Transistor (MOSFET). It should be noted that the present disclosure is not limited thereto. Each of the driving transistor DT and the first and second transistors ST1 and ST2 may be embodied as an N-type MOSFET.

Hereinafter, a manufacturing method of a display device according to one or more embodiments will be described in detail. FIG. 8-FIG. 20 are cross-sectional views for illustrating the manufacturing method of the display device according to one or more embodiments.

Figure 8:
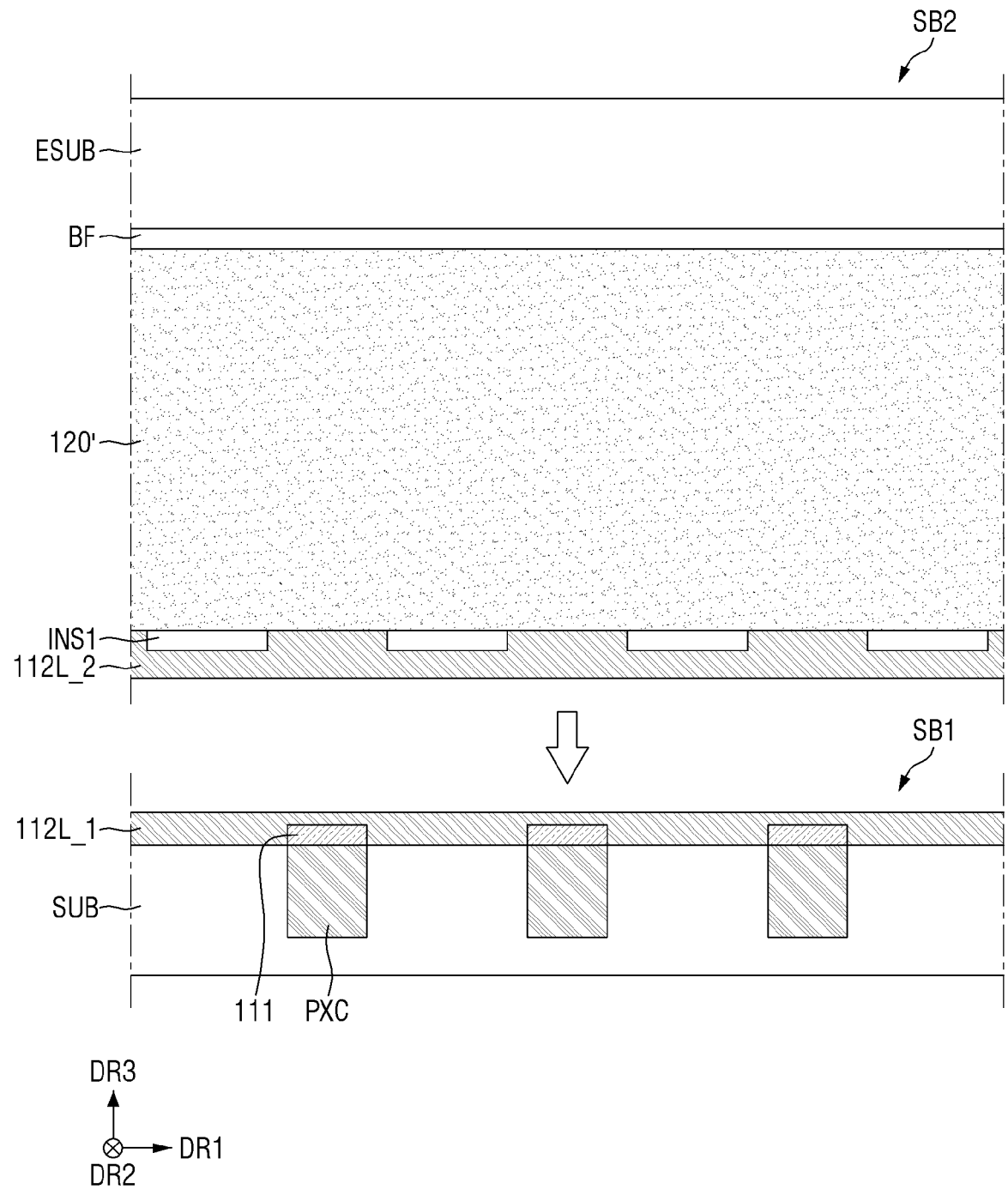
FIG. 8-FIG. 20 are cross-sectional views for illustrating a manufacturing method of a display device according to one or more embodiments.
Figure 9:
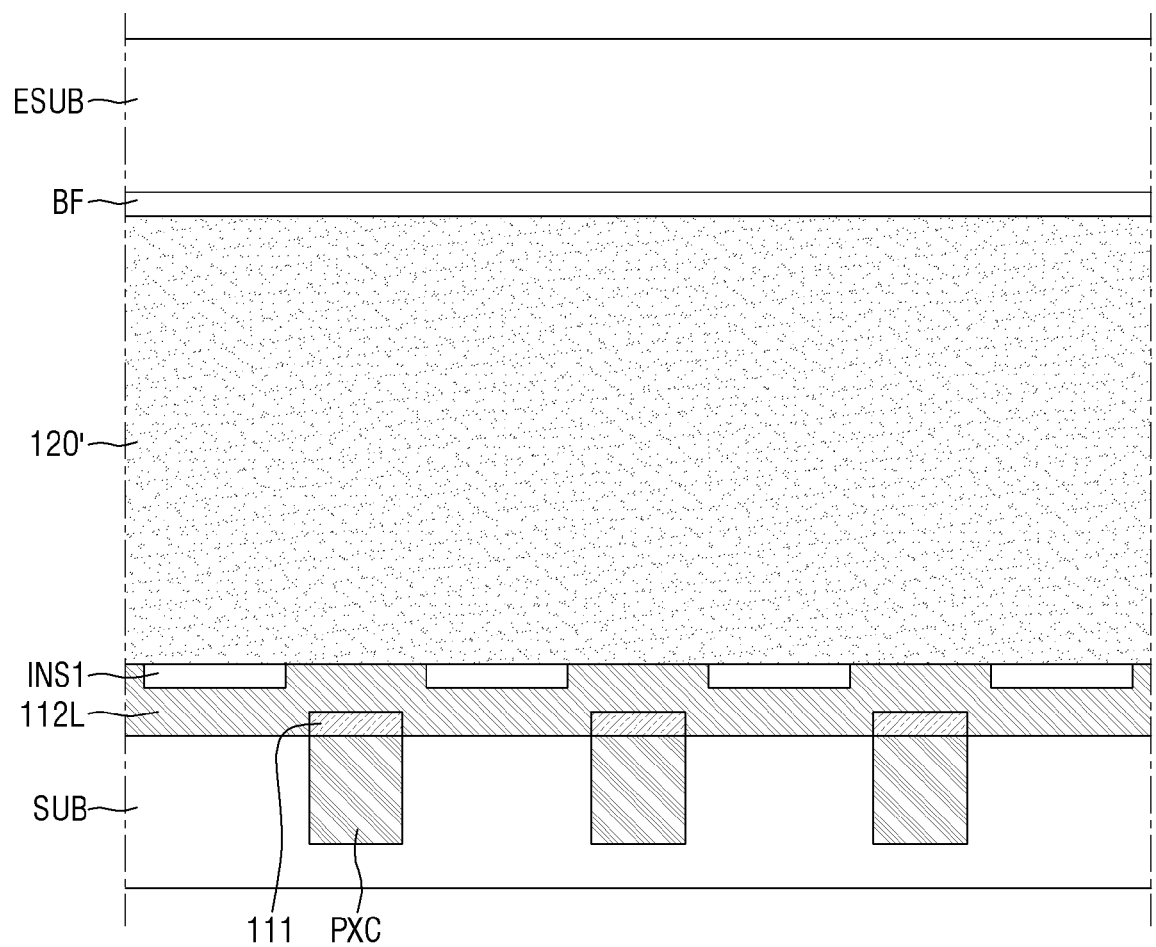

First, referring to FIG. 8 and FIG. 9, a first sub-substrate SB1 and a second sub-substrate SB2 spaced from each other are bonded to each other via a first connection electrode layer 112L_1 and a second connection electrode layer 112L_2.

The first sub-substrate SB1 may include the base substrate SUB, the pixel circuit PXC, the pixel electrode 111, the first connection electrode layer 112L_1, and the first insulating film INS1. The second sub-substrate SB2 may include a light emitting element substrate ESUB, and a buffer film BF, a material layer 120' for a light emitting element, and the second connection electrode layer 112L_2 that are sequentially stacked on the light emitting element substrate ESUB. The material layer 120' for the light emitting element may include the first semiconductor layer SEM1, the electron blocking layer EBL, the active layer MQW, the superlattice layer SLT, and the second semiconductor layer SEM2 as shown in FIG. 5.

The first connection electrode layer 112L_1 is deposited to cover (or overlap) pixel electrodes 111 of the semiconductor circuit board 110. The first connection electrode layer 112L_1 may include gold (Au), copper (Cu), aluminum (Al), or tin (Sn). One surface of the first connection electrode layer 112L1 facing the second connection electrode layer 112L2 may be planarized by a polishing process such as a chemical mechanical polishing (CMP) process.

The material layer 120' for the light emitting element may include the first semiconductor layer SEM1, the electron blocking layer EBL, the active layer MQW, the superlattice layer SLT, and the second semiconductor layer SEM2 as shown in FIG. 5. Further, the material layer 120' for the light emitting element may further include an undoped semiconductor layer. In this case, a semiconductor layer not doped with a dopant, that is, the undoped semiconductor layer may be disposed on the buffer film BF, the second semiconductor layer SEM2 may be disposed on the undoped semiconductor layer, the superlattice layer SLT may be disposed on the second semiconductor layer SEM2, the active layer MQW may be disposed on the superlattice layer SLT, the electron blocking layer EBL may be disposed on the active layer MQW, and the first semiconductor layer SEM1 may be disposed on the electron blocking layer EBL.

Figure 22:
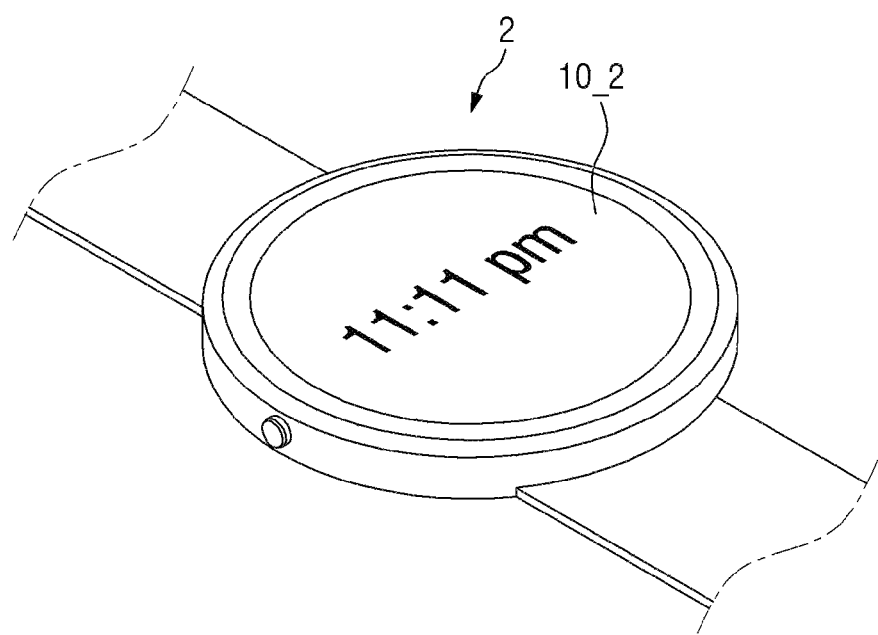
FIG. 22 is an example diagram showing a smart device including a display device according to one or more embodiments.

The first insulating layer INS1 may be patterned on the first semiconductor material layer LEMD. The first insulating layer INS1 may not overlap the pixel electrode 111 in the third direction DR3 as shown in FIG. 22. The first insulating layer INS1 may be formed of an inorganic layer such as a silicon oxide layer ($SiO_2$), an aluminum oxide layer ($Al_2O_3$), or a hafnium oxide layer (HfOx).

The second connection electrode layer 112L_2 may be deposited on the first insulating layer INS1 and the light emitting device layer 120'. The second connection electrode layer 112L_2 may include gold (Au), copper (Cu), aluminum (Al), or tin (Sn). One surface of the second connection electrode layer 112L2 facing the first connection electrode layer 112L1 may be planarized by a polishing process such as a CMP process.

The first connection electrode layer 112L_1 of the first sub-substrate SB1 and the second connection electrode layer 112L_2 of the second sub-substrate SB2 are brought into a contact state with each other. In a state in which the first connection electrode layer 112L_1 and the second connection electrode layer 112L_2 contact each other, the first connection electrode layer 112L_1 and the second connection electrode layer 112L_2 are melt-bonded to each other at a suitable temperature (e.g., a set or predefined temperature), thereby forming a single monolithic connection electrode layer 112L. Accordingly. The semiconductor circuit board 110 and the light emitting element substrate ESUB may be bonded to each other.

Then, referring to FIG. 10, the light emitting element substrate ESUB and the buffer film BF are removed. Then, the planarization layer FL, a first mask pattern MP1 and a second mask pattern MP2 are placed on the material layer 120' for the light emitting element.

The light emitting element substrate ESUB and the buffer film BF may be removed via a polishing process such as Chemical Mechanical Polishing (CMP) process and an etching process. However, the present disclosure is not limited thereto.

The planarization layer FL is formed on one face (e.g., one surface) of the material layer 120' for the light emitting element which is exposed by removing the light emitting element substrate ESUB and the buffer film BF. The planarization layer FL may include a transparent conductive oxide (TCO). A thickness of the planarization layer FL may be, for example, in a range of 1 nm to 1000 nm, or in a range of 50 nm to 100 nm. However, the present disclosure is not limited thereto.

The first mask pattern MP1 is disposed on the planarization layer FL. The first mask pattern MP1 may be formed in an area where the first partitioning wall PW1 and the light emitting element LE will be formed subsequently. Because a width of the light emitting element LE is larger than a width of the first partitioning wall PW1, a width of a portion of the first mask pattern MP1 formed in an area where the light emitting element LE is to be formed may be larger than a width of a portion of the first mask pattern MP1 formed in an area where the first partitioning wall PW1 is to be formed. The first mask pattern MP1 may include an inorganic film such as a silicon oxide film (SiO2 film), an aluminum oxide film (Al2O3 film), or a hafnium oxide film (HfOx film). A thickness of the first mask pattern MP1 may be in a range of approximately 1 to 2 μm.

The second mask pattern MP2 may be disposed on a portion of the first mask pattern MP1. The second mask pattern MP2 may be formed in an area where the first partitioning wall PW1 will be formed subsequently. The second mask pattern MP2 may include a conductive material such as nickel (Ni). A thickness of the second mask pattern MP2 may be in a range of about 0.01 to 1 μm.

Then, referring to FIG. 11, the material layer 120' for the light emitting element is partially etched.

For example, using the first mask pattern MP1 as an etching mask, the planarization layer FL and the material layer 120' for the light emitting element are etched. In other words, a portion of the planarization layer FL and a portion of the material layer 120' for the light emitting element covered with the first mask pattern MP1 and overlapping with the first mask pattern MP1 may not be etched, while a portion of the planarization layer FL and a portion of the material layer 120' for the light emissive element not covered with the first mask pattern MP1 may be etched. The etching may allow a recess to be defined in the portion of the planarization layer FL that is not covered with the first mask pattern MP, wherein the recess extends in the thickness direction. The portion of the material layer 120' for the light emitting element not covered with the first mask pattern MP may be at least partially etched. Because the material layer 120' for the light emitting element partially overlaps the first mask pattern MP1, a top face of the material layer 120' for the light emitting element has a step.

A vertical level of one face (e.g., one surface) or a top face (e.g., a top surface) of a portion of the material layer 120' for the light emitting element overlapping with the first mask pattern MP1 may be higher than a vertical level of one face (e.g., one surface) or a top face (e.g., a top surface) of a portion of the material layer 120' for the light emitting element not overlapping with the first mask pattern MP1. A thickness of the portion of the material layer 120' for the light emitting element overlapping with the first mask pattern MP1 may be greater than a thickness of the portion of the material layer 120' for the light emitting element non-overlapping with the first mask pattern MP1.

Figure 12:
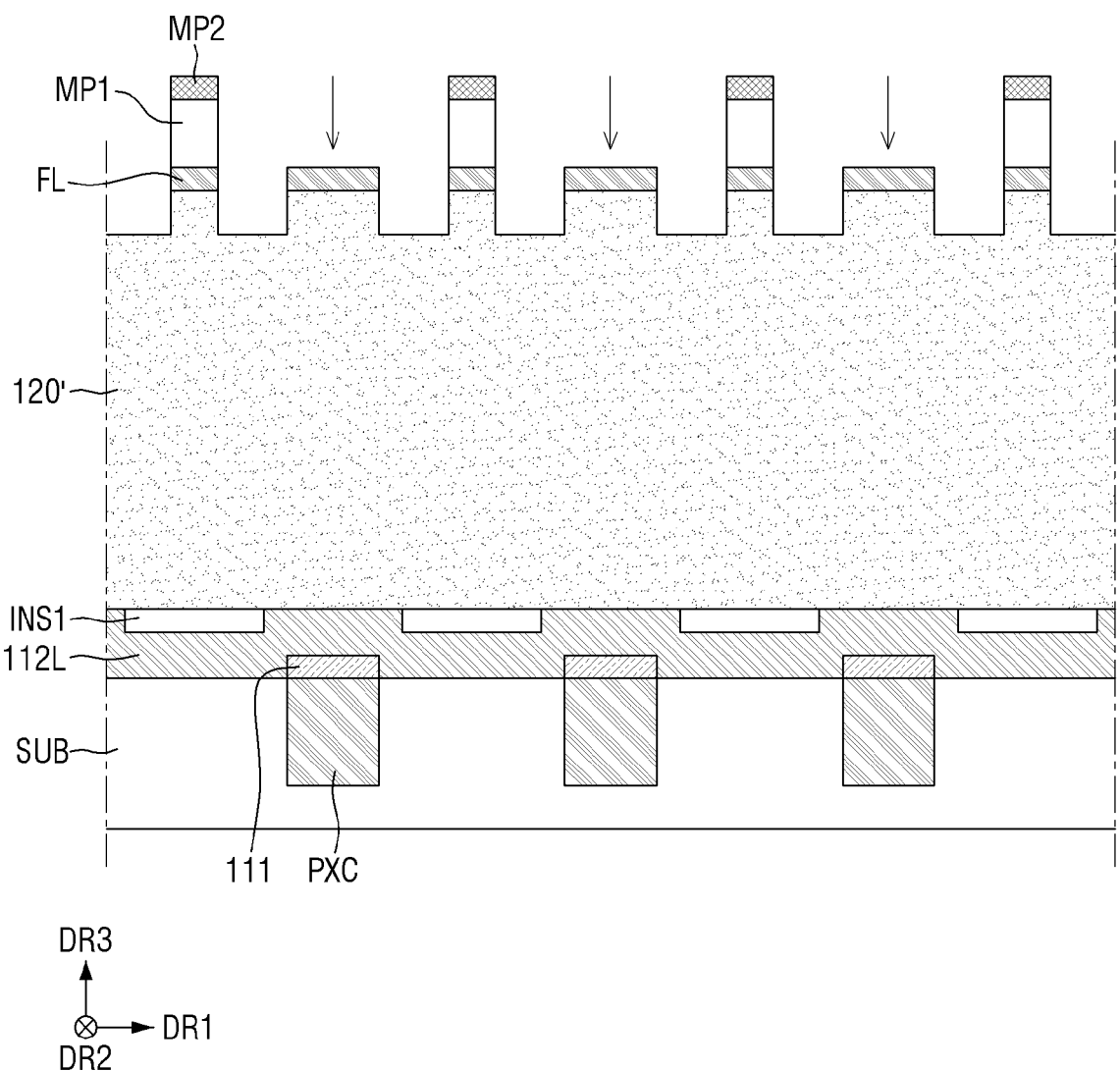

Then, referring to FIG. 12, a portion of the first mask pattern MP1 that does not overlap with the second mask pattern MP2 is removed.

The portion of the first mask pattern MP1 that does not overlap with the second mask pattern MP2 may be removed by dry etching. However, the present disclosure is not limited thereto. When the portion of the first mask pattern MP1 that does not overlap the second mask pattern MP2 is removed by the dry etching, a portion of the planarization layer FL that overlaps the portion of the first mask pattern MP1 which is etched may not be etched. In other words, when the first mask pattern MP1 includes an inorganic film such as a silicon oxide film (SiO2 film), an aluminum oxide film (Al2O3 film), or a hafnium oxide film (HfOx film), an etching gas used for etching the portion of the first mask pattern MP1 that does not overlap the second mask pattern MP2 may be based carbon (C), or fluorine (F). For example, the etching gas used for etching the portion of the first mask pattern MP1 that does not overlap the second mask pattern MP2 may be carbon tetrafluoride (CF4). When carbon tetrafluoride(CF4) is used as the etching gas, the planarization layer FL including the transparent conductive material may not be etched.

Figure 13:
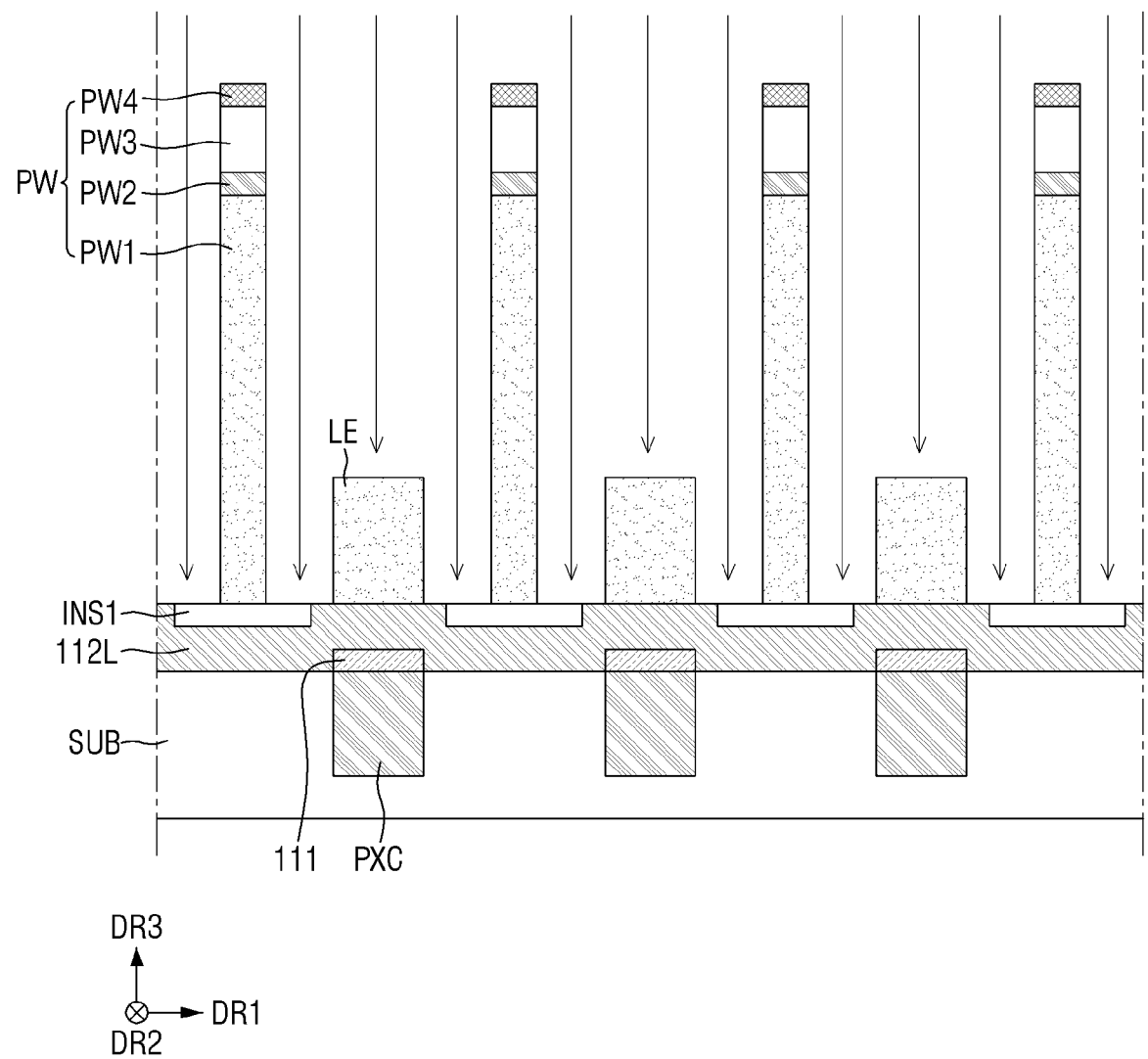

Then, referring to FIG. 13, using the second mask pattern MP2, the planarization layer FL and the material layer 120' for the light emitting element are etched to form the light emitting elements LE and the partitioning wall PW.

For example, the partitioning wall PW may be formed in an area where all of the planarization layer FL, the first mask pattern MP1, and the second mask pattern MP2 are disposed, while the light emitting element LE may be formed in an area where the planarization layer FL is disposed and the first mask pattern MP1 and the second mask pattern MP2 are not disposed. In an area where all of the planarization layer FL, the first mask pattern MP1, and the second mask pattern MP2 are absent, the material layer 120' for the light emitting element may be entirely removed.

A process of etching the planarization layer FL and the material layer 120' for the light emitting element may include a dry etching process. However, the present disclosure is not limited thereto. When the dry etching process is used, an etching gas may be based on chlorine (Cl), and the planarization layer FL and the material layer 120' for the light emitting element may be co-etched.

Co-etching the planarization layer FL and the material layer 120' for the light emitting element may allow the light emitting element LE and the partitioning wall PW to be formed concurrently (or simultaneously). In an area where the planarization layer FL is disposed, the material layer 120' for the light emitting element may at least partially remain to form the light emitting elements LE. The partitioning wall PW may be formed in an area in which the second mask pattern MP2 is disposed. The partitioning wall PW may include the first partitioning wall PW1 corresponding to the material layer 120' for the light emitting element, the second partitioning wall PW2 corresponding to the planarization layer FL, the third partitioning wall PW3 corresponding to the first mask pattern MP1, and the fourth partitioning wall PW4 corresponding to the second mask pattern MP2.

Concurrently forming (e.g., simultaneously forming) the partitioning wall PW and the light emitting element LE using the planarization layer FL, the first mask pattern MP1 and the second mask pattern MP2 may allow the manufacturing process to be simplified.

In addition, one face (e.g., one surface) or a top face (e.g., a top surface) of the light emitting element LE may be more planarized due to a portion of the planarization layer FL disposed in an area in which the second mask pattern MP2 is absent.

In other words, in an area in which the second mask pattern MP2 is absent, the planarization layer FL is disposed, but the first mask pattern MP1 is not disposed. Thus, in the area, the light emitting element LE is formed. In this case, in a process of etching the material layer 120' for the light emitting element, an edge thereof may be first and physically etched using a gas such as argon (Ar) injected together with the chlorine-based etching gas. Therefore, in the process of forming the light emitting element LE using the first mask pattern MP1 as a mask, the first mask pattern MP1 may have a shape in which a central portion protrudes convexly. After the first mask pattern MP1 has been completely etched, a central portion of the light emitting element LE may have a convex shape.

However, when the first mask pattern MP1 disposed in the area in which the second mask pattern MP2 is absent is entirely removed and the planarization layer FL including the transparent conductive material is disposed therein, the planarization layer FL and the material layer 120' for the light emitting element may be chemically etched together using the chlorine-based etching gas. Accordingly, one face (e.g., one surface) or a top face (e.g., a top surface) of the light emitting element LE formed using the planarization layer FL disposed in the area in which the second mask pattern MP2 is absent as a mask may be more planarized. Accordingly, an amount of the wavelength conversion layer QDL disposed between adjacent partitioning walls PW may increase, such that color conversion of blue light emitting from the light emitting element LE may be performed more reliably, and light leakage of the blue light may be suppressed or prevented. Further, as the amount of the wavelength conversion layer QDL (see, for example, FIG. 4) increases, light efficiency of each of the light-emitting areas EA1, EA2, EA3 (see, for example, FIG. 4) may be improved.

Figure 14:
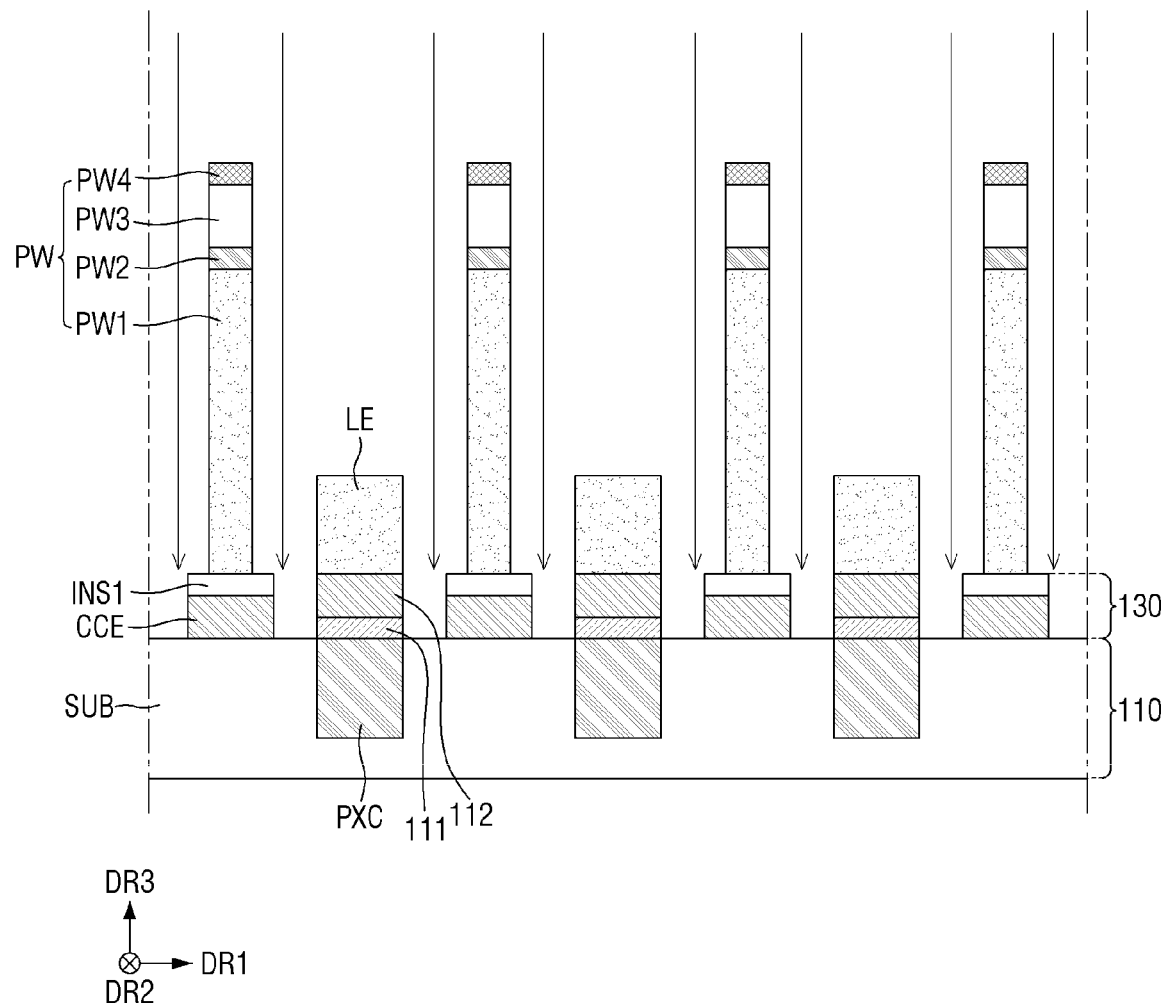

Then, referring to FIG. 14, the connection electrode layer 112L is etched to form the connection electrodes 112 and the common connection electrode CCE.

For example, the light emitting elements LE may not be etched using an etching material used for etching the connection electrode layer 112L. For this reason, a portion of the connection electrode layer 112L in an area where the light emitting elements LE are disposed may not be etched.

An etch rate of the connection electrode layer 112L etched using the etching material may be higher than an etch rate of the first insulating film INS1 etched using the etching material. Therefore, a portion of the connection electrode layer 112L disposed above the first insulating film INS1 may be removed by the etching material, while a portion of the connection electrode layer 112L disposed under the first insulating film INS1 may not be completely removed by the etching material, but may partially remain. Therefore, the connection electrode 112 may be formed in an area of each of the light emitting elements LE. The common connection electrode CCE spaced from the connection electrode 112 may be formed. When wet etching is performed, the etching material may be an etching liquid.

Further, a portion of the connection electrode layer 112L disposed under the partitioning wall PW may not be etched by the etching material. Therefore, the connection electrode 112 may be disposed below the first insulating film INS1.

Figure 15:
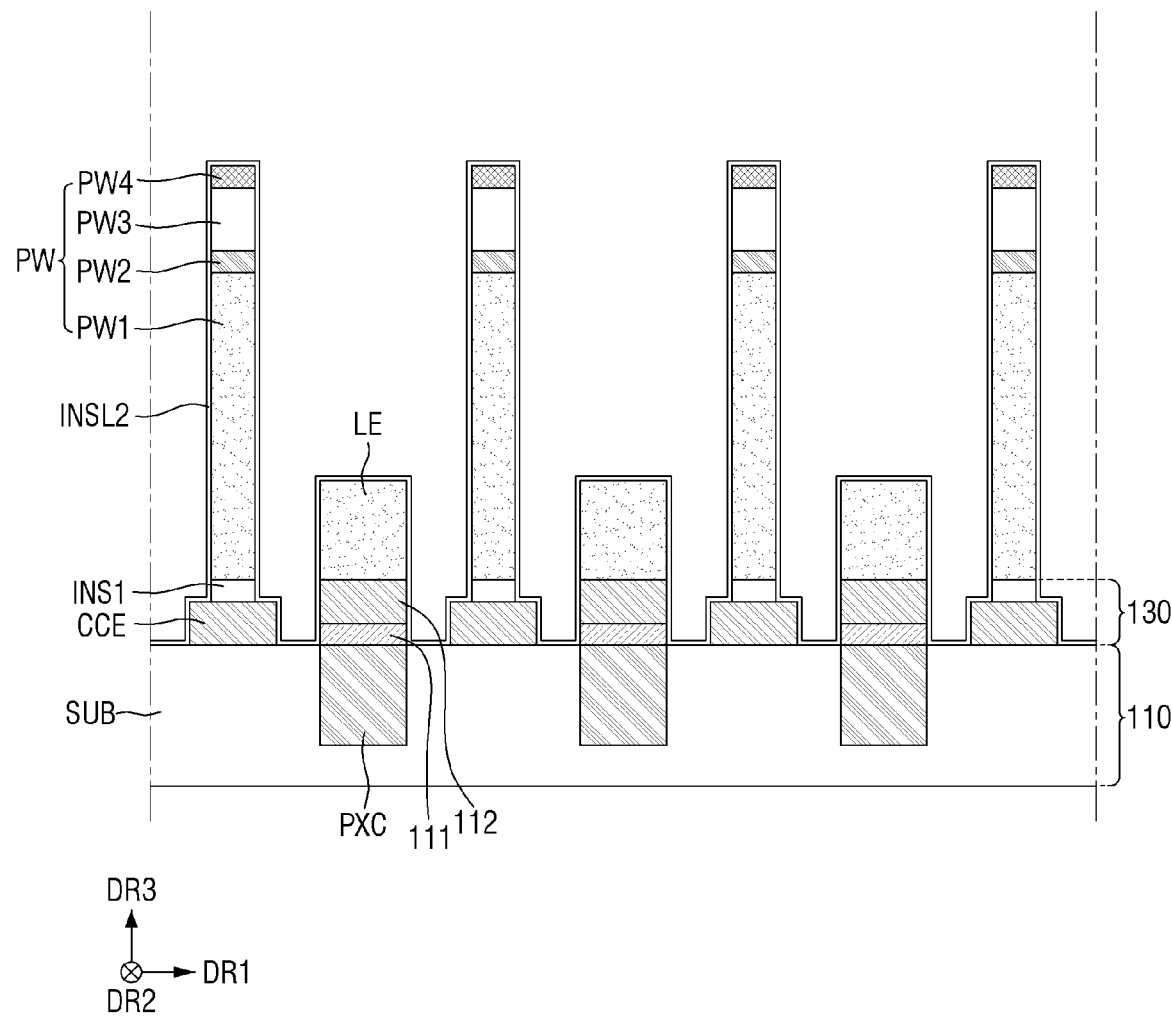
Figure 16:
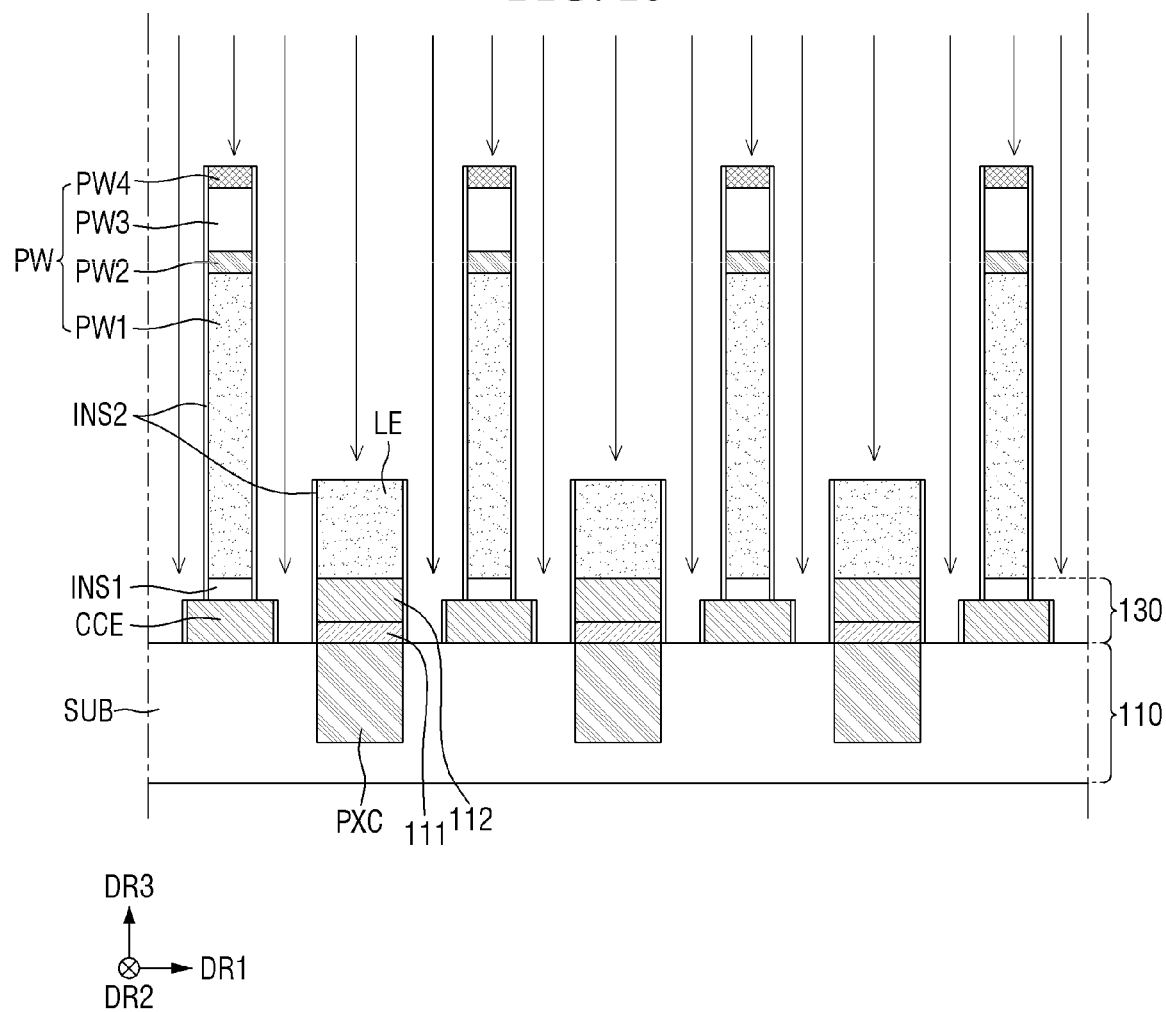

Then, referring to FIG. 15 and FIG. 16, a second insulating film layer INSL2 is disposed on the plurality of light emitting elements LE and the partitioning wall PW. The second insulating film layer INSL2 is partially etched to form the insulating film INS2 as a residue of the second insulating film INS2.

For example, the second insulating film layer INSL2 is deposited on an entire face (e.g., an entire surface) of the semiconductor circuit board 110. In this case, the second insulating film layer INSL2 may be disposed on a top face (e.g., a top surface) and side faces (e.g., side surfaces) of the common connection electrode CCE, a top face (e.g., a top surface) and side faces (e.g., side surfaces) of the partitioning wall PW, side faces (e.g., side surfaces) of each of the pixel electrodes 111, a top face (e.g., a top surface) and side faces (e.g., side surfaces) of each of the connection electrodes 112, a top face (e.g., a top surface) and side faces (e.g., side surfaces) of each of the light emitting elements LE, and a portion of a top face (e.g., a top surface) of the semiconductor circuit board 110 between the pixel electrode 111 and the common connection electrode CCE.

Then, when etching using a suitable etching gas (e.g., a predefined etching gas) is performed without a separate mask while a large voltage difference in the third direction DR3 is generated, a horizontal portion of the second insulating film layer INSL2 disposed along a horizontal plane defined by the first direction DR1 and the second direction DR2 may be removed. In contrast, a vertical portion of the second insulating film layer INSL2 disposed along a vertical plane extending in the third direction DR3 may not be removed.

That is, a portion of the second insulating film layer INSL2 disposed on the top face (e.g., the top surface) of the common connection electrode CCE, the top face (e.g., the top surface) of the partitioning wall PW, the top face (e.g., the top surface) of each of the light emitting elements LE, and a portion of the top face (e.g., the top surface) of the semiconductor circuit board 110 between the pixel electrode 111 and the common connection electrode CCE may be removed. In contrast, a portion of the second insulating film layer INSL2 disposed on the side faces (e.g., the side surfaces) of the common connection electrode CCE, the side faces (e.g., the side surfaces) of the partitioning wall PW, the side faces (e.g., the side surfaces) of each of the pixel electrodes 111, the side faces (e.g., the side surfaces) of each of the connection electrodes 112, and the side faces (e.g., the side surfaces) of each of the light emitting elements LE may not be removed, such that the second insulating film INS2 is formed as a residue of the second insulating film layer INSL2. Therefore, the second insulating film INS2 may be formed on the side faces (e.g., the side surfaces) of the common connection electrode CCE, the side faces (e.g., the side surfaces) of the partitioning wall PW, the side faces (e.g., the side surfaces) of each of the pixel electrodes 111, the side faces (e.g., the side surfaces) of each of the connection electrodes 112, and the side faces (e.g., the side surfaces) of each of the light emitting elements LE.

In one example, because an upper portion of a vertical potion of the second insulating film layer INSL2 disposed on each of the side faces (e.g., the side surfaces) of the partitioning wall PW may be partially removed by the etching gas, a vertical level of a top of the vertical portion of the second insulating film INS2 disposed on each of the side faces (e.g., the side surfaces) of the partitioning wall PW may be lower than a vertical level of the top face (e.g., the top surface) of the partitioning wall PW. Similarly, because an upper portion of a vertical potion of the second insulating film layer INSL2 disposed on each of the side faces (e.g., the side surfaces) of each of the light emitting elements LE may be partially removed by the etching gas, a vertical level of a top of the vertical portion of the second insulating film INS2 disposed on each of the side faces (e.g., the side surfaces) of each of the light emitting elements LE may be lower than a vertical level of the top face (e.g., the top surface) of each of the light emitting elements LE.

Figure 17:
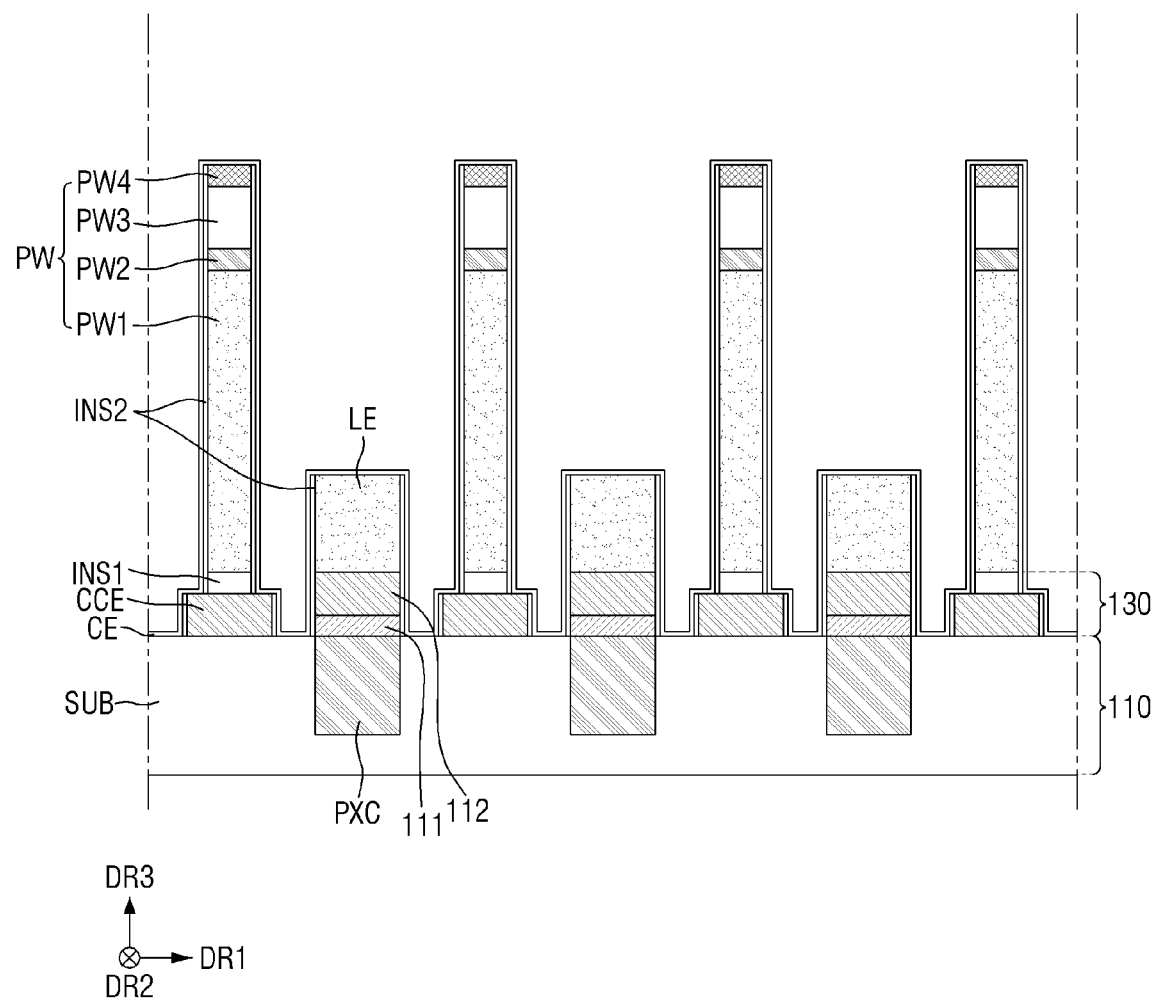

Then, referring to FIG. 17, the common electrode CE connecting the top face (e.g., the top surface) of each of the plurality of light emitting elements LE and the common connection electrode CCE is formed.

For example, the common electrode CE is deposited on an entire face (e.g., an entire surface) of the display area DA of the semiconductor circuit board 110. In this case, the common electrode CE may be disposed on the top face (e.g., the top surface) of the common connection electrode CCE, the top face (e.g., the top surface) of the partitioning wall PW, the top face (e.g., the top surface) of each of the light emitting elements LE, and a portion of the top face (e.g., the top surface) of the semiconductor circuit board 110 between the pixel electrode 111 and the common connection electrode CCE. Further, common electrode CE may be disposed on a portion of the second insulating film INS2 disposed on the side faces (e.g., the side surfaces) of the common connection electrode CCE, the side faces (e.g., the side surfaces) of the partitioning wall PW, the side faces (e.g., the side surfaces) of each of the pixel electrodes 111, the side faces (e.g., the side surfaces) of each of the connection electrodes 112, and the side faces (e.g., the side surfaces) of each of the light emitting elements LE.

Because a portion of the top face (e.g., the top surface) of the common connection electrode CCE is not covered with the first insulating film INS1 but is exposed, the portion of the top face (e.g., the top surface) of the common connection electrode CCE that is not covered with the first insulating film INS1 may contact the common electrode CE. Therefore, the common electrode CE may be connected to the common connection electrode CCE.

Partially etching the connection electrode layer 112L using the first insulating film INS1 and the light emitting elements LE as a mask may allow the connection electrode 112 and the common connection electrode CCE to be formed at the same time. Thus. the manufacturing process may be simplified.

Figure 18:
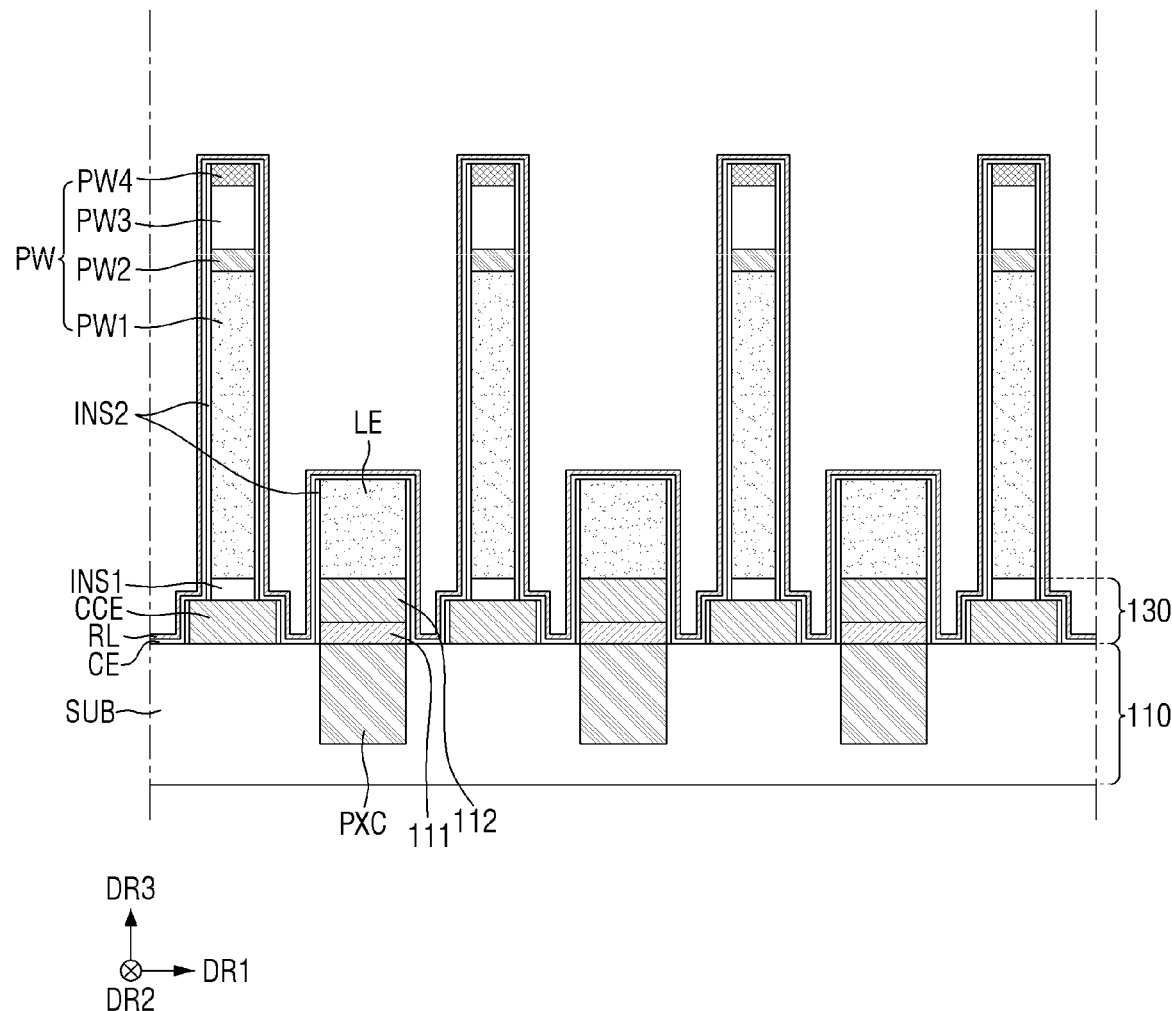
Figure 19:
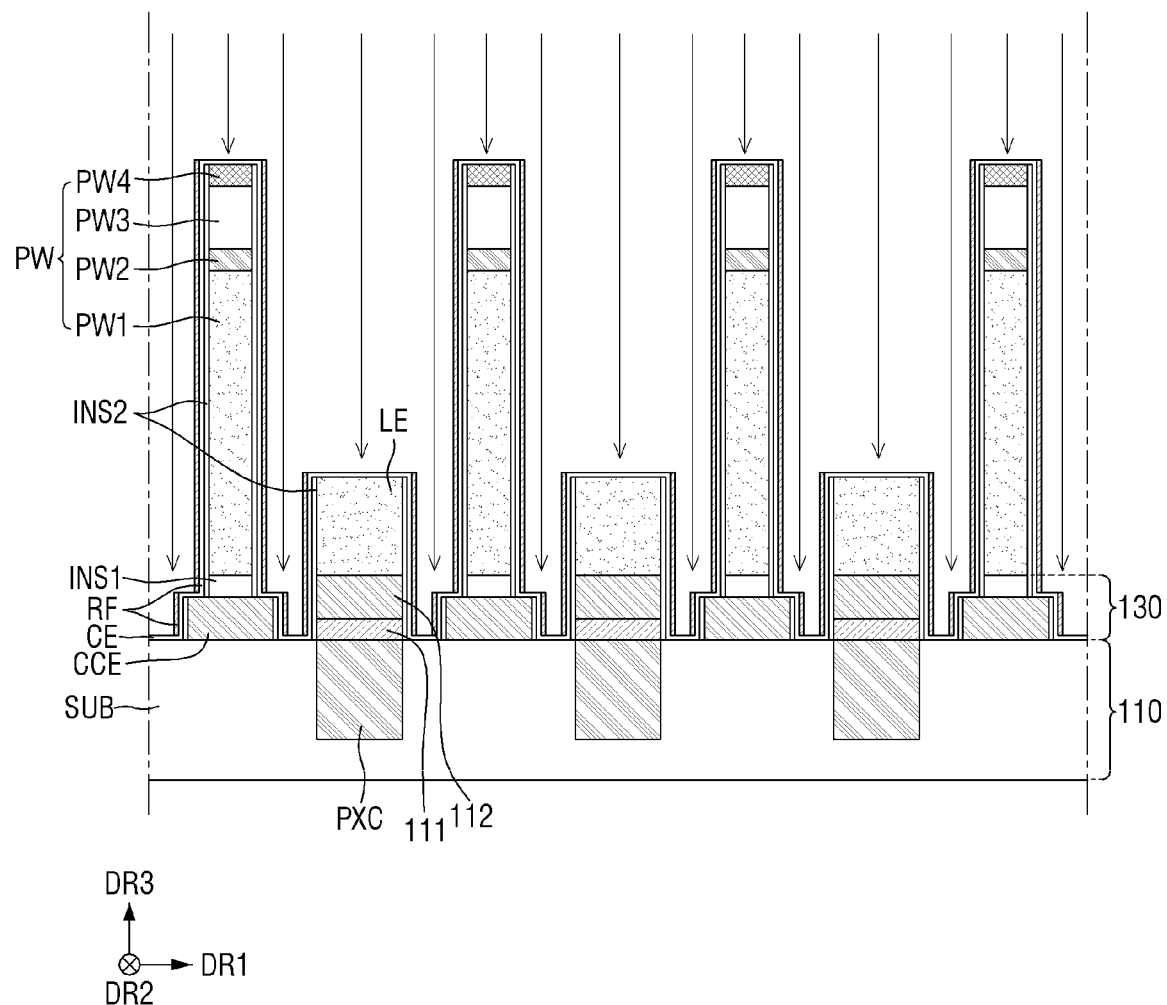

Then, referring to FIG. 18 and FIG. 19, a material layer RL for a reflective film is formed on the plurality of light emitting elements LE and the partitioning wall PW, and is partially etched to form the reflective film RF.

For example, the material layer RL for the reflective film is deposited on an entire face (e.g., an entire surface) of the semiconductor circuit board 110. In this case, the material layer RL for the reflective film may be disposed on a portion of the common electrode CE disposed on the top face (e.g., the top surface) and the side faces (e.g., the side surfaces) of the common connection electrode CCE, the top face (e.g., the top surface) and the side faces (e.g., the side surfaces) of the partitioning wall PW, the side faces (e.g., the side surfaces) of each pixel electrode 111, and the side faces (e.g., the side surfaces) of each of the connection electrode 112, the top face (e.g., the top surface) and the side faces (e.g., the side surfaces) of each of the light emitting elements LE, and a portion of the top face (e.g., the top surface) of the semiconductor circuit board 110 between the pixel electrode 111 and the common connection electrode CCE.

Then, when etching using a suitable etching gas (e.g., a predefined etching gas) is performed without a separate mask while a large voltage difference in the third direction DR3 is generated, a horizontal portion of the material layer RL for the reflective film disposed along a horizontal plane defined by the first direction DR1 and the second direction DR2 may be removed. In contrast, a vertical portion of the material layer RL for the reflective film disposed along a vertical plane extending in the third direction DR3 may not be removed.

That is, a portion of the material layer RL for the reflective film disposed on the top face (e.g., the top surface) of the common connection electrode CCE, the top face (e.g., the top surface) of the partitioning wall PW, the top face (e.g., the top surface) of each of the light emitting elements LE, and a portion of the top face (e.g., the top surface) of the semiconductor circuit board 110 between the pixel electrode 111 and the common connection electrode CCE may be removed. In contrast, a portion of the material layer RL for the disposed reflective film disposed on the side faces (e.g., the side surfaces) of the common connection electrode CCE, the side faces (e.g., the side surfaces) of the partitioning wall PW, the side faces (e.g., the side surfaces) of each of the pixel electrodes 111, the side faces (e.g., the side surfaces) of each of the connection electrodes 112, and the side faces (e.g., the side surfaces) of each of the light emitting elements LE may not be removed but remain. Thus, the reflective film RF may be formed as a residue thereof. Therefore, the reflective film RF may be disposed on a portion of the common electrode CE disposed on the side faces (e.g., the side surfaces) of the common connection electrode CCE, the side faces (e.g., the side surfaces) of the partitioning wall PW, the side faces (e.g., the side surfaces) of each of the pixel electrodes 111, the side faces (e.g., the side surfaces) of each of the connection electrodes 112, and the side faces (e.g., the side surfaces) of each of the light emitting elements LE.

In one example, because a portion of an upper portion of the vertical portion of the material layer RL for the reflective film disposed along the side faces (e.g., the side surfaces) of the partitioning wall PW may be removed, a vertical level of a top of the vertical portion of the reflective film RF disposed on the side faces (e.g., the side surfaces) of the partitioning wall PW may be lower than a vertical level of the top face (e.g., the top surface) of the partitioning wall PW. Similarly, because a portion of the upper portion of the vertical portion of the material layer RL for the reflective film disposed along the side faces (e.g., the side surfaces) of each of the light emitting elements LE may be removed, a vertical level of a top of the vertical portion of the reflective film RF disposed along the side faces (e.g., the side surfaces) of each of the light emitting elements LE may be lower than a vertical level of the top face (e.g., the top surface) of the light emitting element LE.

Figure 20:
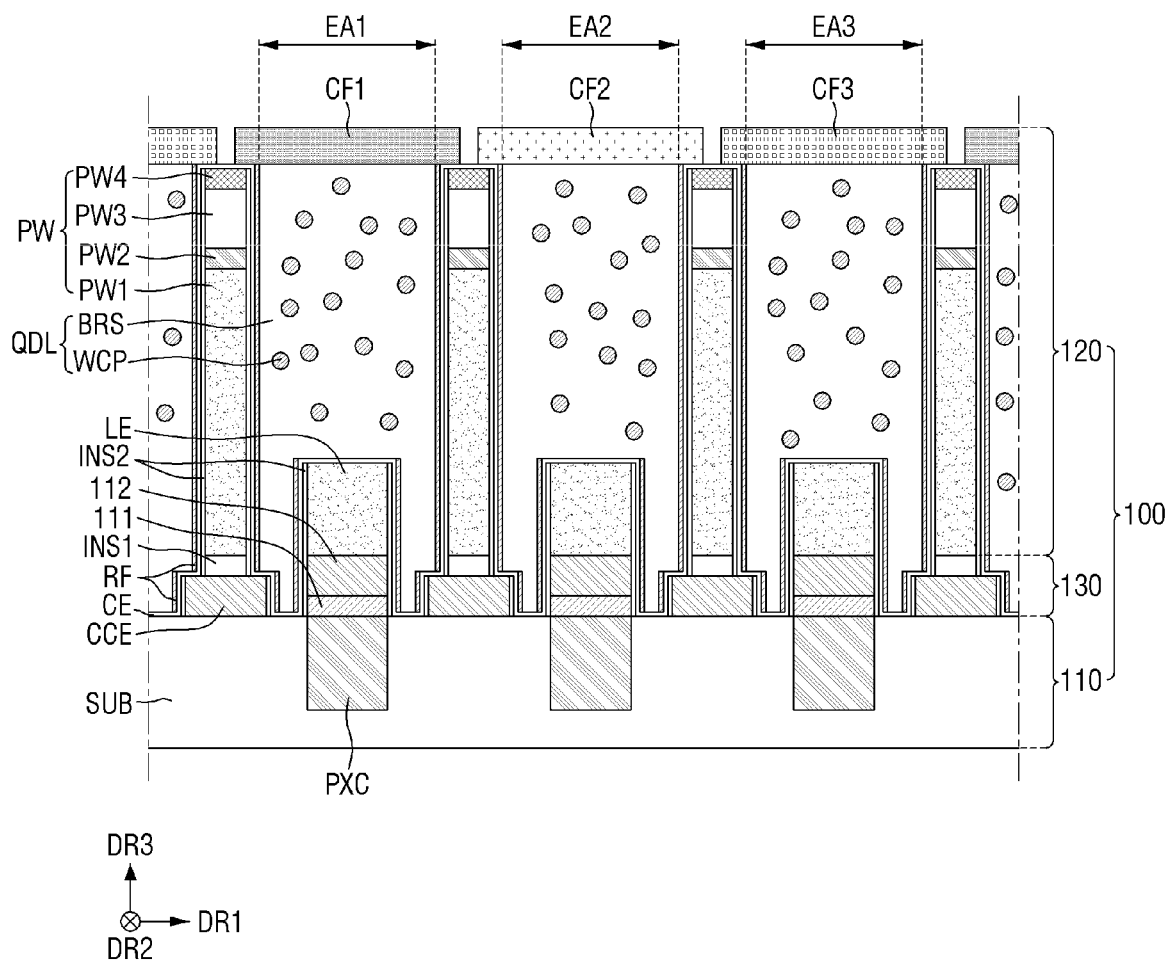

Then, referring to FIG. 20, the wavelength conversion layer QDL is formed on the light emitting element LE and in each of the plurality of light-emitting areas EA1, EA2, and EA3 defined by the partitioning wall PW. Then, the color filters CF1, CF2, and CF3 are formed on the wavelength conversion layer QDL.

For example, the wavelength conversion layer QDL is formed on the light emitting element LE and in each of the first light-emitting area EA1, the second light-emitting area EA2, and the third light-emitting area EA3. The wavelength conversion layer QDL may fill a space surrounded with the partitioning wall PW. The wavelength conversion layer QDL may fill a space between adjacent partitioning walls PW, and may fill a space between the partitioning wall PW and the light emitting element LE.

Then, the first color filter CF1 may be formed on the wavelength conversion layer QDL and in the first light-emitting area EA1, the second color filter CF2 may be formed on the wavelength conversion layer QDL and in the second light-emitting area EA2, and the third color filter CF3 may be formed on the wavelength conversion layer QDL and in the third light-emitting area EA3.

Hereinafter, an application example of the display device 10 according to one or more embodiments will be described with reference to FIG. 21-FIG. 24. However, the application example of the display device 10 is not limited thereto.

Figure 21:
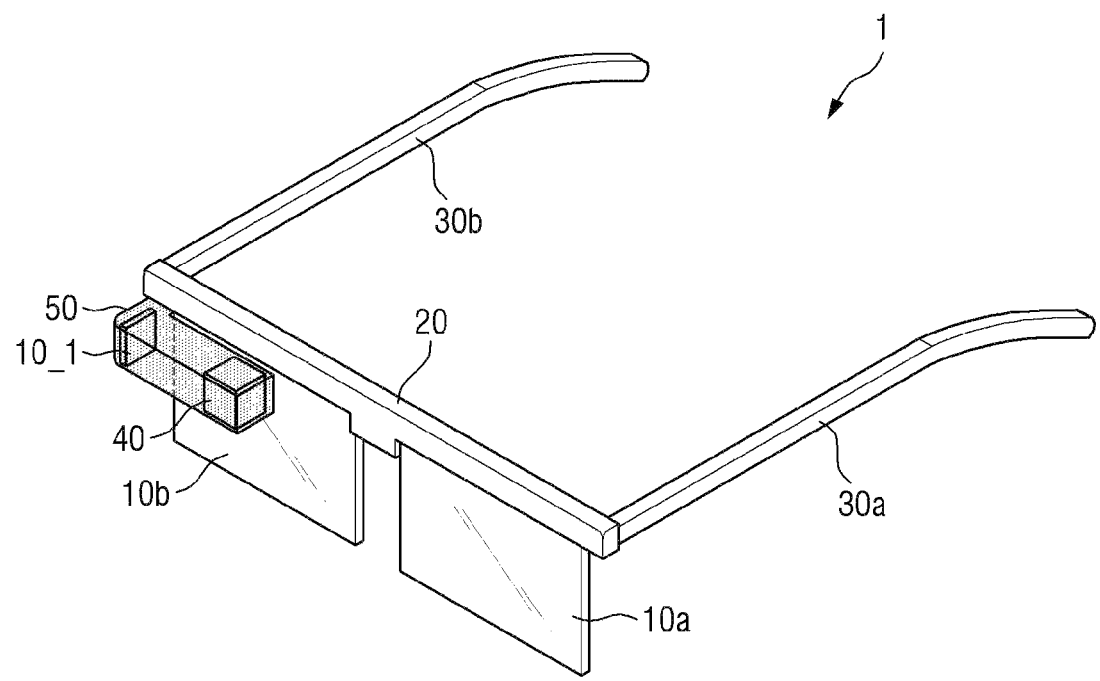
FIG. 21 is an example diagram showing a virtual reality device including a display device according to one or more embodiments.

FIG. 21 is an example diagram showing a virtual reality device including a display device according to one or more embodiments. FIG. 21 shows a virtual reality device 1 to which a display device 10_1 according to one or more embodiments are applied.

Referring to FIG. 21, the virtual reality device 1 according to one or more embodiments may be a device in a form of glasses. The virtual reality device 1 according to one or more embodiments may include a display device 10_1, a left-eye lens 10a, a right-eye lens 10b, a support frame 20, left and right legs 30a and 30b, a reflective member 40, and a display device housing 50.

FIG. 21 exemplifies the virtual reality device 1 including the two legs 30a and 30b. However, the present disclosure is not limited thereto. The virtual reality device 1 according to one or more embodiments may be applied to a head mounted display including a head mounted band that may be mounted on a head instead of the legs 30a and 30b. That is, the virtual reality device 1 according to one or more embodiments may not be limited to the example shown in FIG. 21, and may be applied in various forms and in various electronic devices.

The display device housing 50 may receive the display device 10_1 and the reflective member 40. An image displayed on the display device 10_1 may be reflected from the reflective member 40 and provided to a user's right-eye through the right-eye lens 10b. Thus, the user may view a virtual reality image displayed on the display device 10_1 via the right-eye.

FIG. 21 illustrates that the display device housing 50 is disposed at a right end of the support frame 20. However, one or more embodiments of the present disclosure are not limited thereto. For example, the display device housing 50 may be disposed at a left end of the support frame 20. In this case, the image displayed on the display device 10_1 may be reflected from the reflective member 40 and provided to the user's left-eye via the left-eye lens 10a. Thus, the user may view the virtual reality image displayed on the display device 10_1 via the left-eye. Alternatively, the display device housing 50 may be disposed at each of the left end and the right end of the support frame 20. In this case, the user may view the virtual reality image displayed on the display device 10_1 via both the left-eye and the right-eye.

FIG. 22 is an example diagram showing a smart device including a display device according to one or more embodiments.

Referring to FIG. 22, a display device 10_2 according to one or more embodiments may be applied to a smart watch 2 as one of smart devices.

Figure 23:
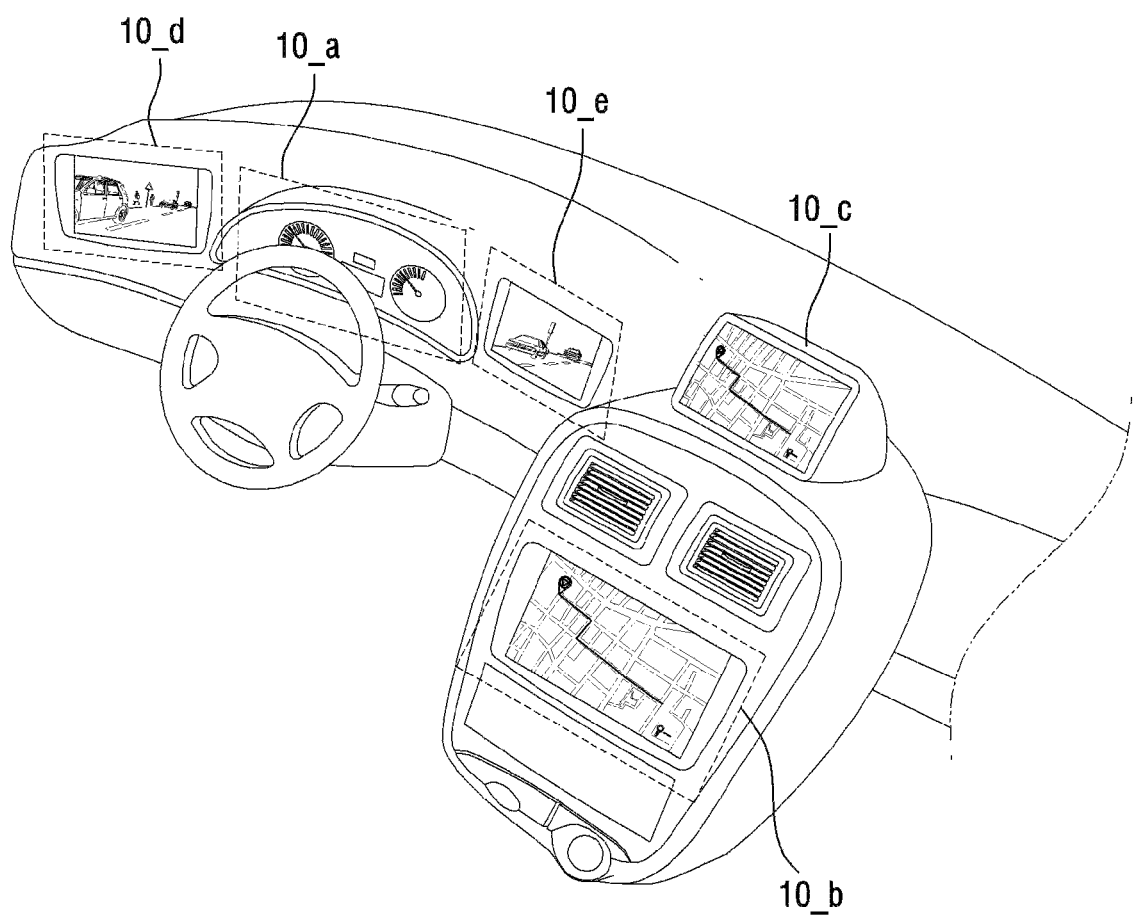
FIG. 23 is a diagram showing a vehicle dashboard and a center fascia, each including a display device according to one or more embodiments.

FIG. 23 is a diagram showing a vehicle dashboard and a center fascia, each including a display device according to one or more embodiments. FIG. 23 shows a vehicle to which display devices 10_a, 10_b, 10_c, 10_d, and 10_e according to one or more embodiments are applied.

Referring to FIG. 23, the display devices 10_a, 10_b, and 10_c according to one or more embodiments may be applied to the dashboard of the vehicle, applied to the center fascia of the vehicle, or applied to a Center Information Display (CID) disposed on the dashboard of the vehicle. Further, each of the display devices 10_d and 10_e according to one or more embodiments may be applied to each room mirror display that replaces each of side mirrors of the vehicle.

Figure 24:
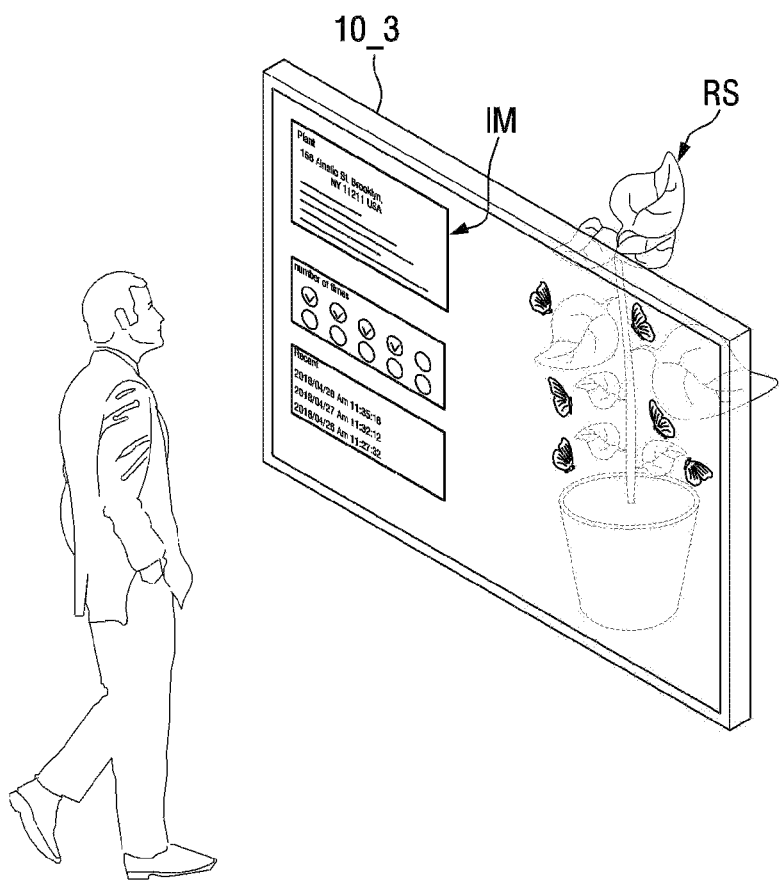
FIG. 24 is one example diagram showing a transparent display device including a display device according to one or more embodiments.

FIG. 24 is one example diagram showing a transparent display device including a display device according to one or more embodiments.

Referring to FIG. 24, a display device 10_3 according to one or more embodiments may be applied to a transparent display device. The transparent display device may transmit light therethrough while displaying an image IM thereon. Therefore, a user located in front of the transparent display device may not only view the image IM displayed on the display device 10_3, but also see an object RS or a background located in rear of the transparent display device. When the display device 10_3 is applied to the transparent display device, a first substrate SUB (e.g., see FIG. 4 and FIG. 5) of the display device 10_3 may include a light transmitting portion that may transmit light therethrough or may be made of a material that may transmit light therethrough.

Hereinafter, other embodiments will be described. In following embodiments, the description of the same configurations as those of the already described embodiments will be omitted or simplified. Following descriptions will be focused on differences therebetween.

Figure 25:
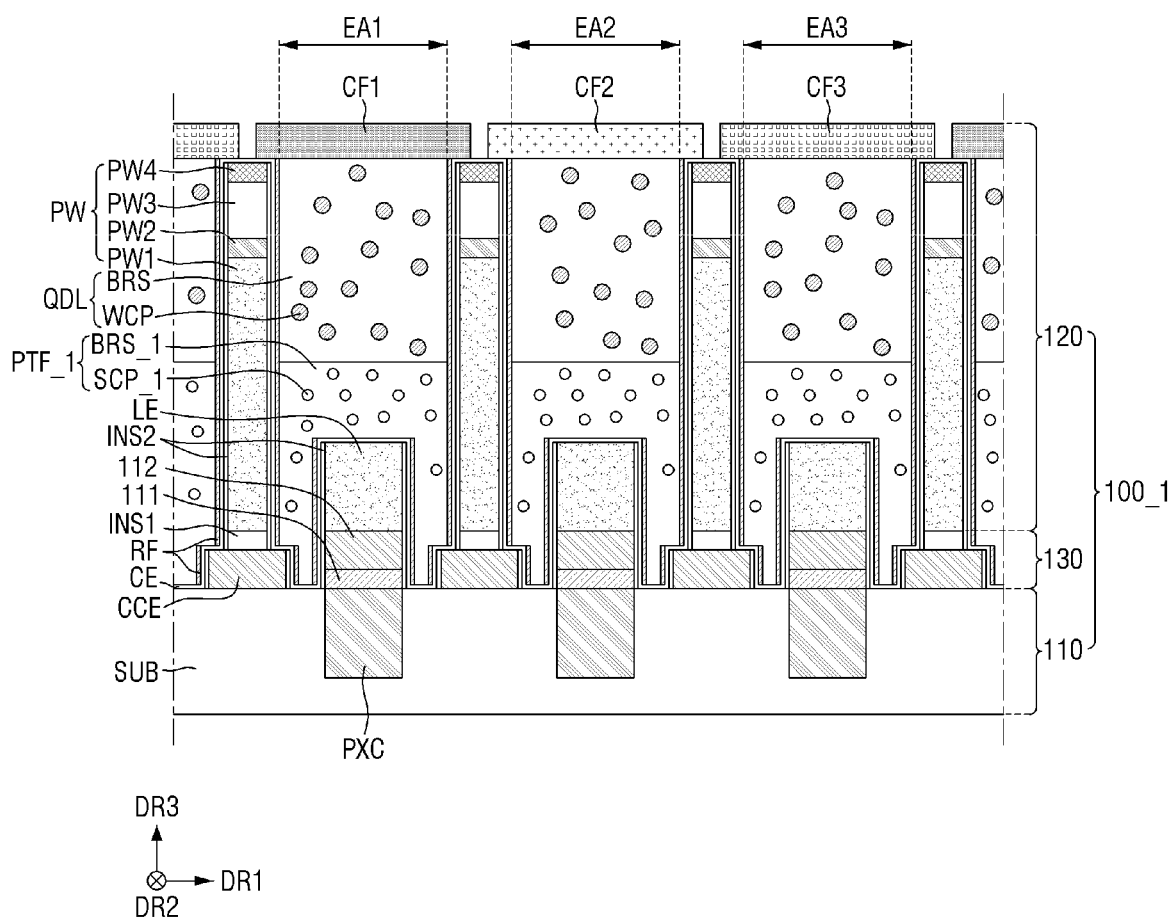
FIG. 25 is a cross-sectional view of a display panel according to one or more embodiments.

FIG. 25 is a cross-sectional view of a display panel according to another embodiment.

Referring to FIG. 25, another display panel 100_1 in this embodiment is different from that of the embodiment in FIG. 4 in that the former may further include a scattering layer PTF_1 disposed between the wavelength conversion layer QDL and the light emitting element LE.

The scattering layer PTF_1 may include a base resin BRS_1 and scattering particles SCP. The base resin BRS_1 of the scattering layer PTF_1 may be substantially the same as the base resin BRS of the wavelength conversion layer QDL. However, the present disclosure is not limited thereto. The scattering particles SCP may be dispersed in the base resin BRS_1 of the scattering layer PTF_1. The scattering particles SCP may scatter light emitting from the light emitting element LE in random directions.

In this case, the partitioning wall PW may include the second partitioning wall PW2. In the process of forming the light emitting element LE, the planarization layer FL (e.g., see FIG. 11) may be used, such that one face (e.g., one surface) or the top face (e.g., the top surface) of the light emitting element LE may be more planarized. In addition, presence of the scattering layer PTF_1 may increase a length of an optical path along which light travels through the wavelength conversion layer QDL, thereby further increasing color conversion efficiency due to the wavelength conversion layer QDL.

Figure 26:
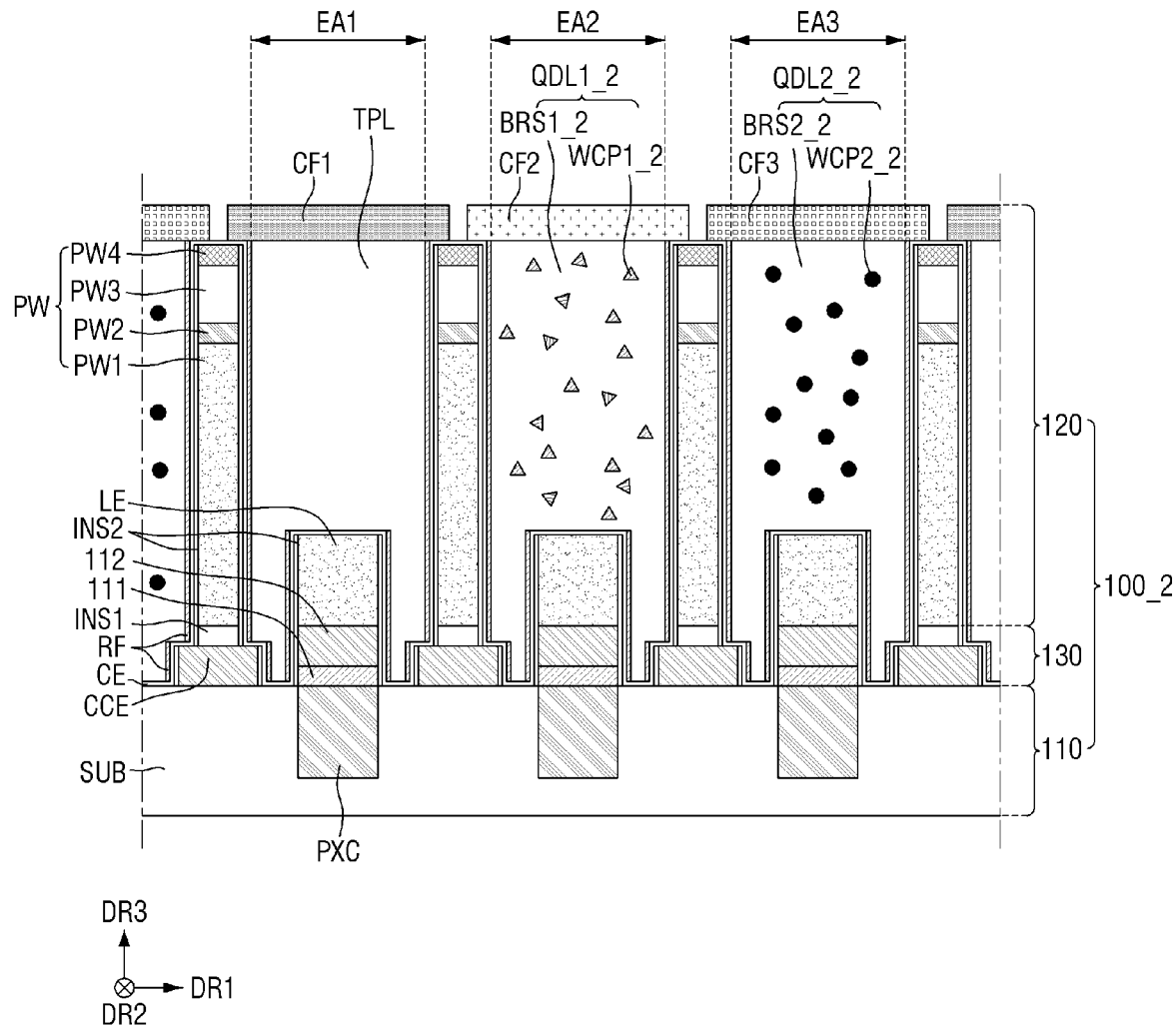
FIG. 26 is a cross-sectional view of a display panel according to one or more embodiments.

FIG. 26 is a cross-sectional view of a display panel according to one or more embodiments.

Referring to FIG. 26, a display panel 100_2 according to this embodiment is different from that of the embodiment in FIG. 4 in that the former includes a light-transmissive layer TPL and wavelength conversion layers QDL1_2, and QDL2_2.

The light-transmissive layer TPL and the wavelength conversion layers QDL1_2, and QDL2_2 may fill a space between adjacent partitioning walls PW and in each of the light-emitting areas EA1, EA2, and EA3. The light-transmissive layer TPL may be disposed in the first light-emitting area EA1, the first wavelength conversion layer QDL1_2 may be disposed in the second light-emitting area EA2, and the second wavelength conversion layer QDL2_2 may be disposed in the third light-emitting area EA3.

The light-transmissive layer TPL may include a light-transmissive organic material. Accordingly, light of a first color emitting from the light emitting element LE may transmit through the light-transmissive layer TPL as it is. For example, the light-transmissive layer TPL may transmit therethrough blue light emitting from the light emitting element LE as it is.

The first wavelength conversion layer QDL1_2 may include a base resin BRS1_2 and first wavelength conversion particles WCP1_2. The base resin BRS1_2 of the first wavelength conversion layer QDL1_2 may be substantially the same as the base resin BRS of FIG. 4. The first wavelength conversion particles WCP1_2 may convert the light of the first color emitting from the light emitting element LE to light of a second color. For example, the first wavelength conversion particles WCP1_2 may convert light of a blue wavelength band into light of a green wavelength band. The first wavelength conversion particle WCP1_2 may include an quantum dot (QD), a quantum rod, a fluorescent material, or a phosphorescent material.

The second wavelength conversion layer QDL2_2 may include a base resin BRS2_2 and second wavelength conversion particles WCP2_2. The base resin BRS2_2 of the second wavelength conversion layer QDL2_2 may be substantially the same as the base resin BRS of FIG. 4. The second wavelength conversion particles WCP2_2 may convert the light of the first color emitting from the light emitting element LE to light of a third color. For example, the second wavelength conversion particle WCP2_2 may convert light of a blue wavelength band into light of a red wavelength band. The second wavelength conversion particle WCP2_2 may include a quantum dot (QD), a quantum rod, a fluorescent material or a phosphorescent material.

In this case, the partitioning wall PW may include the second partitioning wall PW2. In the process of forming the light emitting element LE, the planarization layer FL (e.g., see FIG. 11) may be used, such that one face (e.g., one surface) or the top face (e.g., top surface) of the light emitting element LE may be more planarized. In addition, when necessary, a material filling the space between the partitioning walls PW may be modified in various ways, so that various designs may be realized.

Figure 27:
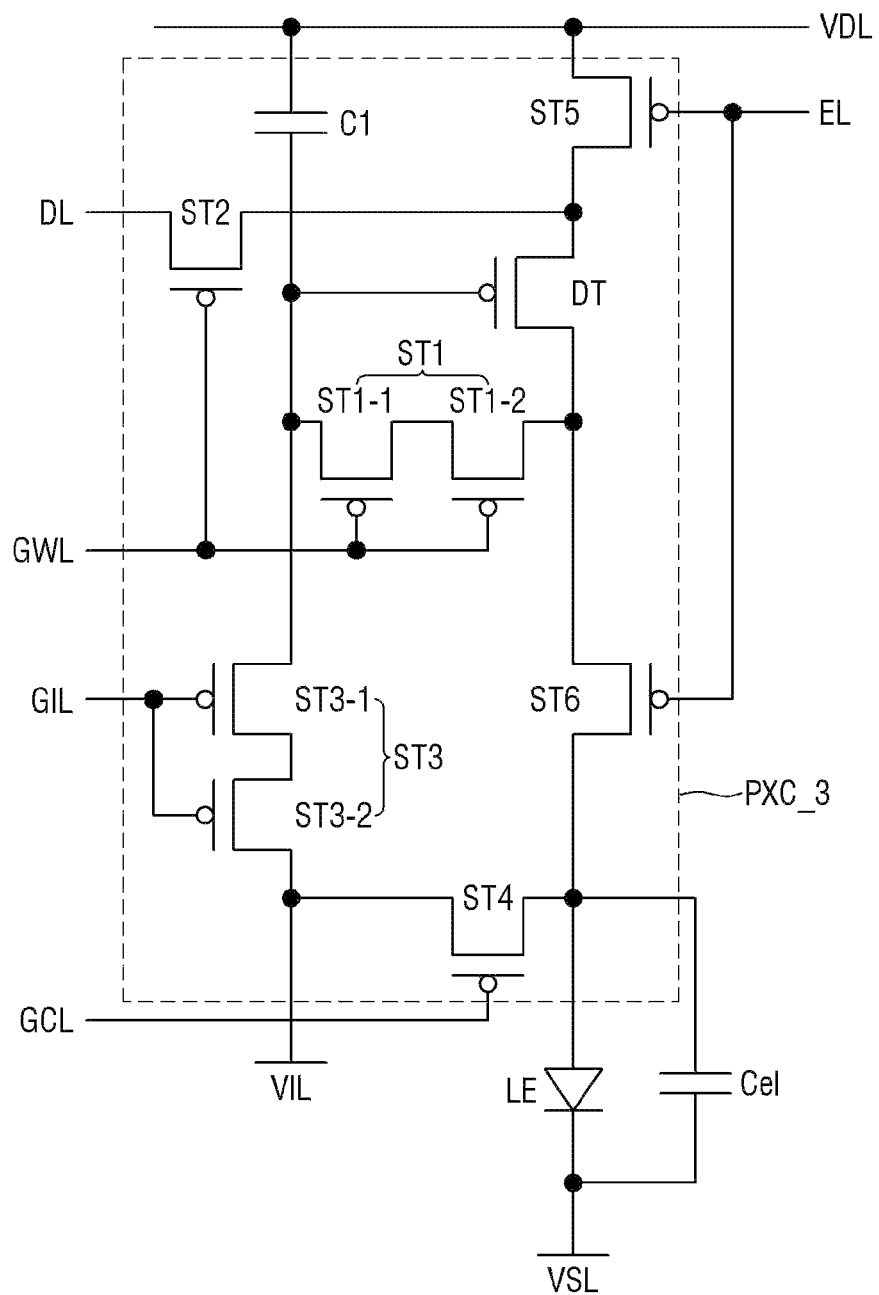
FIG. 27 is a circuit diagram of a pixel circuit and a light emitting element according to one or more embodiments.

FIG. 27 is a circuit diagram of a pixel circuit and a light emitting element according to one or more embodiments. FIG. 27 shows an example of a pixel circuit PXC_3 and the light emitting element LE of FIG. 4

Referring to FIG. 27, the light emitting element LE emits light based on the drive current. An emission amount of the light emitting element LE may be proportional to an amount of the drive current. The light emitting element LE may be embodied as an inorganic light emitting element including an anode, a cathode, and an inorganic semiconductor disposed between the anode and the cathode. For example, the light emitting element LE may be embodied as a micro light-emitting diode.

The anode of the light emitting element LE may be connected to a first electrode of a fourth transistor ST4 and a second electrode of a sixth transistor ST6, while the cathode thereof may be connected to the first power line VSL. A parasitic capacitance Cel may be formed between the anode and the cathode of the light emitting element LE.

The pixel circuit PXC_3 includes a driving transistor DT, switch elements, and a capacitor C1. The switch elements includes first to sixth transistors ST1, ST2, ST3, ST4, ST5, and ST6.

The driving transistor DT includes a gate electrode, a first electrode, and a second electrode. The driving transistor DT controls a drain-source current (hereinafter referred to as "drive current") flowing between the first electrode and the second electrode based on a data voltage applied to the gate electrode of the drive transistor DT.

The capacitor C1 is formed between the gate electrode of the driving transistor DT and the first power line VDL. One electrode of the capacitor C1 may be connected to the gate electrode of the driving transistor DT, and the other electrode thereof may be connected to the first power line VDL.

While a first electrode of each of the first to sixth transistors ST1, ST2, ST3, ST4, ST5, and ST6, and the driving transistor DT may act as a source electrode, a second electrode thereof may act as a drain electrode. Alternatively, while the first electrode of each of the first to sixth transistors ST1, ST2, ST3, ST4, ST5, and ST6, and the driving transistor DT may act as a drain electrode, the second electrode thereof may act as a source electrode.

An active layer of each of the first to sixth transistors ST1, ST2, ST3, ST4, ST5, and ST6, and the driving transistor DT may be made of one of polysilicon, amorphous silicon, and oxide semiconductor. When the active layer of each of the first to sixth transistors ST1, ST2, ST3, ST4, ST5, and ST6, and the driving transistor DT is made of polysilicon, a Low Temperature Poly Silicon (LTPS) process may be employed to form the active layer.

Further, FIG. 27 shows that each of the first to sixth transistors ST1, ST2, ST3, ST4, ST5, and ST6, and the driving transistor DT is embodied as a P-type MOSFET. However, the present disclosure is not limited thereto. Each of the first to sixth transistors ST1, ST2, ST3, ST4, ST5, and ST6, and the driving transistor DT may be embodied as a N-type MOSFET.

Furthermore, the first power voltage of the first power line VDL, the second power voltage of the second power line VSL, and a third power voltage of a third power line VIL may be set in consideration of characteristics of the driving transistor DT and characteristics of the light emitting element LE.

Figure 28:
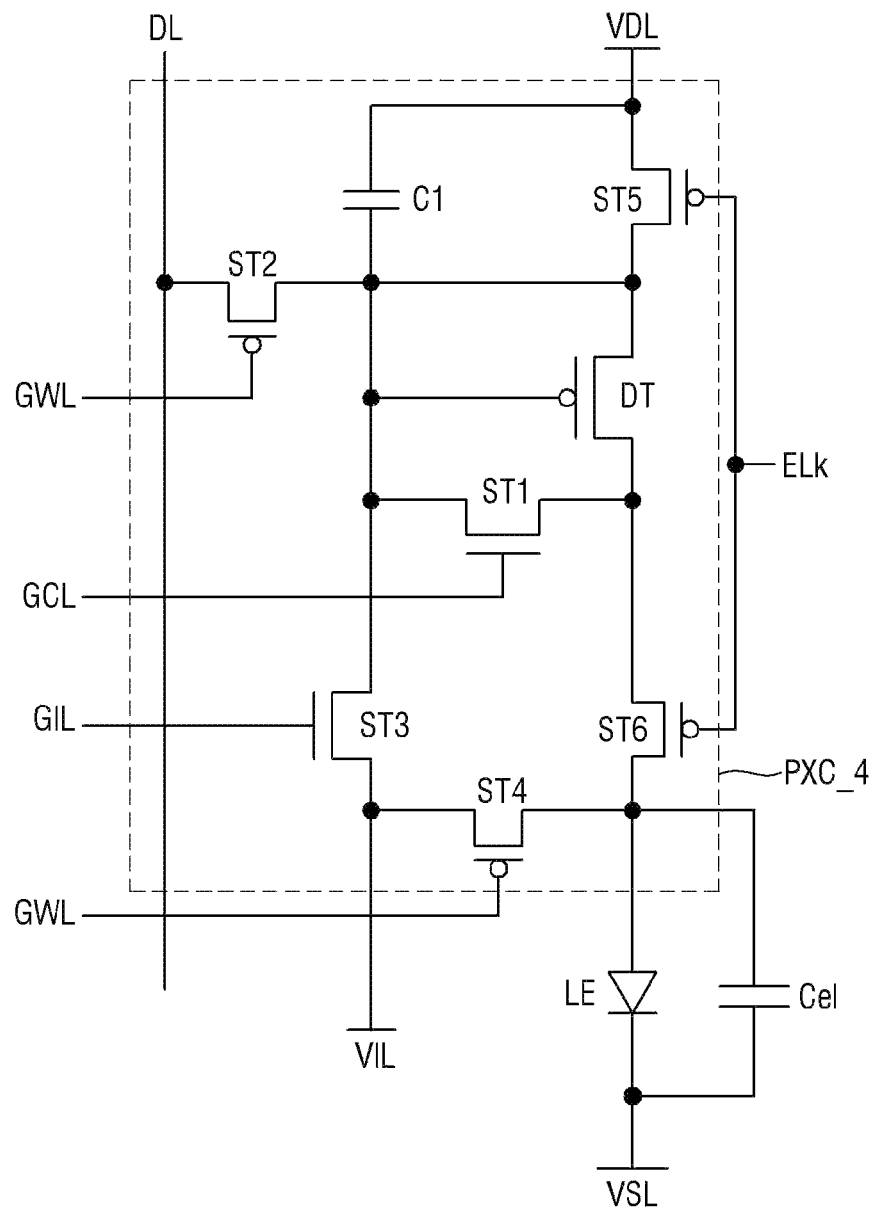
FIG. 28 is a circuit diagram of a pixel circuit and a light emitting element according to one or more embodiments.

FIG. 28 is a circuit diagram of a pixel circuit and a light emitting element according to one or more embodiments.

FIG. 28 shows an example of a pixel circuit PXC_4 and the light emitting element LE of FIG. 4.

The embodiment of FIG. 28 is different from the embodiment in FIG. 27 in that in the embodiment of FIG. 28, each of the driving transistor DT, the second transistor ST2, the fourth transistor ST4, the fifth transistor ST5, and the sixth transistor ST6 is embodied as a P-type MOSFET, while each of the first transistor ST1 and the third transistor ST3 is embodied as an N-type MOSFET.

Referring to FIG. 28, the active layer of each of the driving transistor DT, the second transistor ST2, the fourth transistor ST4, the fifth transistor ST5, and the sixth transistor ST6 embodied as the P-type MOSFET may be made of polysilicon, while the active layer of each of the first transistor ST1 and the third transistor ST3 embodied as the N-type MOSFET may be made of an oxide semiconductor.

The embodiment of FIG. 28 is different from the embodiment in FIG. 27 in that in the embodiment of FIG. 28, a gate electrode of the second transistor ST2 and a gate electrode of the fourth transistor ST4 may be connected to a write scan line GWL, while a gate electrode of the first transistor ST1 may be connected to a control scan line GCL. Further, in FIG. 28, because each of the first transistor ST1 and the third transistor ST3 is embodied as an N-type MOSFET, a scan signal having a gate high voltage level may be applied to the control scan line GCL and an initialization scan line GIL. In contrast, because each of the second transistor ST2, the fourth transistor ST4, the fifth transistor ST5, and the sixth transistor ST6 is embodied as a P-type MOSFET, a scan signal having a gate low voltage level may be applied to the write scan line GWL and a light emitting line EL.

In one example, it should be noted that the pixel circuit PXC_4 according to one or more embodiments of the present disclosure is not limited to those shown in FIG. 7, FIG. 27, and FIG. 28. The pixel circuit PXC_4 according to one or more embodiments of the present disclosure may have known circuit structures employable by those skilled in the art different from those of the embodiments shown in FIG. 7, FIG. 27, and FIG. 28.

However, the aspects and features of embodiments of the present disclosure are not restricted to the one set forth herein. The above and other aspects and features of embodiments of the present disclosure will become more apparent to one of daily skill in the art to which the present disclosure pertains by referencing the claims, with functional equivalents thereof to be included therein.

What is claimed is:

1. A display device comprising:
    a base substrate;
    a partitioning wall on the base substrate, wherein the partitioning wall comprises a first partitioning wall, and a second partitioning wall on the first partitioning wall; and
    a light emitting element spaced from the partitioning wall and located in a space surrounded by the partitioning wall in a plan view,
    wherein the first partitioning wall and the light emitting element comprise a same material,
    wherein the second partitioning wall comprises a transparent conductive oxide.

2. The display device of claim 1, wherein the partitioning wall further comprises:
    a third partitioning wall on the second partitioning wall, wherein the third partitioning wall comprises an inorganic material; and
    a fourth partitioning wall on the third partitioning wall, wherein the fourth partitioning wall comprises a conductive material.

3. The display device of claim 1, wherein the second partitioning wall comprises indium tin oxide (ITO).

4. The display device of claim 1, wherein a thickness of the second partitioning wall is in a range of 50 nm to 100 nm.

5. The display device of claim 1, wherein the display device further comprises:
    a pixel electrode located between the base substrate and the light emitting element; and
    a connection electrode located between the light emitting element and the pixel electrode.

6. The display device of claim 5, wherein the display device further comprises a common electrode on the light emitting element and the partitioning wall,
    wherein the light emitting element is located between the common electrode and the connection electrode.

7. The display device of claim 6, wherein the common electrode is located at a top surface and a side surface of the light emitting element, and on a top surface and a side surface of the partitioning wall.

8. The display device of claim 5, wherein the display device further comprises a common connection electrode overlapping the partitioning wall and spaced from the light emitting element.

9. The display device of claim 8, wherein the common connection electrode and the connection electrode comprises a same material.

10. The display device of claim 5, wherein the light emitting element comprises:
    a first semiconductor layer on the connection electrode;
    an active layer on the first semiconductor layer; and
    a second semiconductor layer on the active layer.

11. The display device of claim 10, wherein the first partitioning wall comprises:
    a first sub-partitioning wall, wherein the first sub-partitioning wall and the first semiconductor layer comprise a same material;
    a second sub-partitioning wall, wherein the second sub-partitioning wall and the active layer comprise a same material;
    a third sub-partitioning wall, wherein the third sub-partitioning wall and the second semiconductor layer comprise a same material; and
    a fourth sub-partitioning wall comprising an undoped semiconductor material.

12. The display device of claim 1, wherein the display device further comprises a scattering layer located on the light emitting element and comprising scattering particles.

13. The display device of claim 12, wherein the display device further comprises a wavelength conversion layer located on the scattering layer and comprising wavelength conversion particles.

14. The display device of claim 1, wherein the display device further comprises:
    a first light-emitting area, a second light-emitting area, and a third light-emitting area defined by the partitioning wall;
    a light-transmissive layer in the first light-emitting area;
    a first wavelength conversion layer in the second light-emitting area; and
    a second wavelength conversion layer in the third light-emitting area,
    wherein the light-transmissive layer transmits light of a first color therethrough,
    wherein the first wavelength conversion layer converts the light of the first color to light of a second color, and
    wherein the second wavelength conversion layer converts the light of the first color to light of a third color.

15. The display device of claim 14, wherein the first color is blue, the second color is green, and the third color is red.

16. A method for manufacturing a display device, the method comprising:
    forming a material layer for a light emitting element on a base substrate;
    forming a planarization layer on the material layer for the light emitting element;
    forming a first mask pattern on the planarization layer;
    forming a second mask pattern on the first mask pattern;
    partially etching the material layer for the light emitting element and the planarization layer using the first mask pattern;
    removing a portion of the first mask pattern not overlapping the second mask pattern; and
    partially etching the planarization layer and the material layer for the light emitting element using the second mask pattern to form a light emitting element and a partitioning wall,
    wherein the partitioning wall is spaced from and surrounds the light emitting element, and
    wherein the planarization layer comprises a transparent conductive oxide.

17. The method of claim 16, wherein the partitioning wall comprises a first partitioning wall, and a second partitioning wall located thereon,
- wherein the first partitioning wall and the light emitting element comprises a same material,
- wherein the second partitioning wall comprises the transparent conductive oxide.

18. The method of claim 17, wherein the transparent conductive oxide comprises indium tin oxide (ITO).

19. The method of claim 18, wherein a thickness of the second partitioning wall is in a range of 50 nm to 100 nm.

20. The method of claim 19, wherein the partitioning wall further comprises a third partitioning wall on the second partitioning wall, and a fourth partitioning wall on the third partitioning wall,
- wherein the third partitioning wall and the first mask pattern comprise a same material,
- wherein the fourth partitioning wall and the second mask pattern comprise a same material.

\* \* \* \* \*